US010483243B2

(12) United States Patent
Kim et al.

(10) Patent No.: US 10,483,243 B2
(45) Date of Patent: *Nov. 19, 2019

(54) SEMICONDUCTOR DEVICES INCLUDING STACKED SEMICONDUCTOR CHIPS

(71) Applicant: Samsung Electronics Co., Ltd., Suwon-si, Gyeonggi-do (KR)

(72) Inventors: Donghyun Kim, Suwon-si (KR); DooWon Kwon, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/236,882

(22) Filed: Dec. 31, 2018

(65) Prior Publication Data

US 2019/0157245 A1    May 23, 2019

Related U.S. Application Data

(63) Continuation of application No. 15/358,579, filed on Nov. 22, 2016, now Pat. No. 10,199,355.

(30) Foreign Application Priority Data

Nov. 27, 2015 (KR) .................. 10-2015-0167590

(51) Int. Cl.
*H01L 25/065* (2006.01)
*H01L 23/00* (2006.01)
(Continued)

(52) U.S. Cl.
CPC ..... *H01L 25/0657* (2013.01); *B60H 1/00764* (2013.01); *B60H 1/00828* (2013.01);
(Continued)

(58) Field of Classification Search
CPC . H01L 2224/05075; H01L 2224/05076; H01L 2224/05078; H01L 2224/32145; H01L 2225/06513
See application file for complete search history.

(56) References Cited

U.S. PATENT DOCUMENTS 5,473,197 A    12/1995 Idaka
5,859,474 A    1/1999 Dordi
(Continued)

FOREIGN PATENT DOCUMENTS

JP    2005026630    1/2005
JP    2008205260    9/2008
(Continued)

*Primary Examiner* — Scott B Geyer
(74) *Attorney, Agent, or Firm* — Myers Bigel, P.A.

(57) ABSTRACT

A semiconductor device includes a chip stack structure including a first semiconductor chip and a second semiconductor chip stacked on the first semiconductor chip. The first semiconductor chip includes a first substrate, a first circuit layer on a front surface of the first substrate, and a first connecting layer disposed on the first circuit layer and including a first metal pad electrically connected to the first circuit layer. The second semiconductor chip includes a second substrate, a second circuit layer on a front surface of the second substrate, and a second connecting layer disposed on the second circuit layer and including a second metal pad electrically connected to the second circuit layer. The first connecting layer faces the second connecting layer. The first and second metal pads are in contact with each other to couple the first and second semiconductor chips to each other.

18 Claims, 20 Drawing Sheets

(51) Int. Cl.
*H01L 27/146* (2006.01)
*B60K 11/06* (2006.01)
*B60H 1/00* (2006.01)
*B60H 1/32* (2006.01)
*F01P 7/04* (2006.01)
*F01P 11/20* (2006.01)

(52) U.S. Cl.
CPC .............. *B60H 1/321* (2013.01); *B60K 11/06* (2013.01); *H01L 24/02* (2013.01); *H01L 24/16* (2013.01); *H01L 24/17* (2013.01); *H01L 24/32* (2013.01); *H01L 24/73* (2013.01); *H01L 27/1464* (2013.01); *H01L 27/14634* (2013.01); *H01L 27/14636* (2013.01); *H01L 27/14643* (2013.01); *B60H 2001/3248* (2013.01); *B60H 2001/3258* (2013.01); *F01P 7/048* (2013.01); *F01P 11/20* (2013.01); *F01P 2050/24* (2013.01); *H01L 2224/02331* (2013.01); *H01L 2224/16014* (2013.01); *H01L 2224/16145* (2013.01); *H01L 2224/17106* (2013.01); *H01L 2224/32012* (2013.01); *H01L 2224/32145* (2013.01); *H01L 2224/48091* (2013.01); *H01L 2224/73203* (2013.01); *H01L 2225/06513* (2013.01); *H01L 2225/06524* (2013.01); *H01L 2225/06541* (2013.01); *H01L 2225/06548* (2013.01); *H01L 2225/06565* (2013.01)

(56) References Cited

U.S. PATENT DOCUMENTS

| | | | |
|---|---|---|---|
| 6,246,080 | B1 | 6/2001 | Takahashi |
| 8,053,900 | B2 | 11/2011 | Yu |
| 8,697,490 | B2 | 4/2014 | Pendse |
| 8,829,673 | B2 | 9/2014 | Cha |
| 8,846,450 | B2 | 9/2014 | Tong |
| 10,199,355 | B2 * | 2/2019 | Kim ..................... H01L 24/02 |
| 2006/0202347 | A1 | 9/2006 | Egawa |
| 2014/0131841 | A1 | 5/2014 | Tseng |
| 2015/0008593 | A1 | 1/2015 | Takemoto |
| 2015/0262989 | A1 | 9/2015 | Kawasaki |
| 2018/0096988 | A1 | 4/2018 | Long |

FOREIGN PATENT DOCUMENTS

| | | |
|---|---|---|
| KR | 1019990088241 | 12/1999 |
| KR | 1020010061596 | 7/2001 |
| KR | 1020060038595 | 5/2006 |
| KR | 101107806 | 1/2012 |

* cited by examiner

SEMICONDUCTOR DEVICES INCLUDING STACKED SEMICONDUCTOR CHIPS

CROSS-REFERENCE TO RELATED APPLICATIONS

This application is a continuation of U.S. patent application Ser. No. 15/358,579, filed on Nov. 22, 2016, which claims priority under 35 U.S.C. § 119 to Korean Patent Application No. 10-2015-0167590, filed on Nov. 27, 2015, in the Korean Intellectual Property Office, the contents of which are incorporated by reference herein in their entireties.

BACKGROUND

Embodiments of the inventive concepts relate to semiconductor devices and, more particularly, to semiconductor devices including semiconductor chips stacked by a wafer-level stacking method.

As high-capacity, thin, and small semiconductor devices and electronic products using the same have been increasingly in demand, various packaging techniques have been developed for such devices. In some of these packaging techniques, semiconductor chips may be vertically stacked to realize a high density chip stack structure. According to these techniques, semiconductor chips having various functions may be integrated in a smaller area than a general package having one semiconductor chip.

Some semiconductor chips may include image sensors. An image sensor may convert an optical image into an electrical signal. As computer and communication industries have developed, high-performance image sensors have been increasingly demanded in various fields such as those utilizing digital cameras, camcorders, personal communication systems (PCS), game consoles, security cameras, and medical micro cameras.

Image sensors may be categorized as either charge coupled device (CCD) image sensors or complementary metal-oxide-semiconductor (CMOS) image sensors. The driving operation of the CMOS image sensors may be simple. In addition, a single processing circuit of the CMOS image sensor may be integrated on a single chip to reduce the size of the CMOS image sensor. Furthermore, the power consumption of the CMOS image sensor may be very low. Thus, the CMOS image sensor may be used in products having a limited battery capacity.

SUMMARY

Embodiments of the inventive concepts may provide semiconductor devices including chip stack structures with improved electrical characteristics and reliability.

In an aspect of the inventive concepts, a semiconductor device may include a chip stack structure including a first semiconductor chip and a second semiconductor chip stacked on the first semiconductor chip. The first semiconductor chip may include a first substrate, a first circuit layer on a front surface of the first substrate, and a first connecting layer disposed on the first circuit layer and including a first metal pad electrically connected to the first circuit layer. The second semiconductor chip may include a second substrate, a second circuit layer on a front surface of the second substrate, and a second connecting layer disposed on the second circuit layer and including a second metal pad electrically connected to the second circuit layer. The first connecting layer and the second connecting layer may face each other. The first metal pad and the second metal pad may be in contact with each other to couple the first and second semiconductor chips to each other. The first metal pad may include a plurality of first metal pad portions separated from each other by first partitions, and the second metal pad may include a plurality of second metal pad portions separated from each other by second partitions.

In an aspect of the inventive concepts, a semiconductor device may include a first semiconductor chip including a first substrate, a first circuit layer on a front surface of the first substrate, and a first connecting layer on the first circuit layer, and a second semiconductor chip including a second substrate, a second circuit layer on a front surface of the second substrate, and a second connecting layer on the second circuit layer. The first connecting layer may include a first metal pad electrically connected to the first circuit layer. The first metal pad may have a rectangular planar shape. The first metal pad may include a plurality of first metal pad portions arranged in a long-axis direction of the first metal pad, and first partitions between respective ones of the plurality of first metal pad portions. The second connecting layer may include a second metal pad electrically connected to the second circuit layer. The second metal pad may have a rectangular planar shape. The second metal pad may include a plurality of second metal pad portions arranged in a long-axis direction of the second metal pad, and second partitions disposed between respective ones of the plurality of second metal pad portions. The second semiconductor chip may be on the first semiconductor chip in such a way that the first and second connecting layers are in contact with each other and the first and second metal pads intersect each other.

In an aspect of the inventive concepts, a semiconductor device may include a first semiconductor chip and a second semiconductor chip. The first semiconductor chip may include a first substrate, a first circuit layer on the first substrate, a first interlayer insulating layer on the first circuit layer, and a first upper insulating layer on the first interlayer insulating layer. The second semiconductor chip may include a second substrate, a second circuit layer on the second substrate, a second interlayer insulating layer on the second circuit layer, and a second upper insulating layer on the second interlayer insulating layer. The first upper insulating layer may include a plurality of first metal pad portions extending in a first direction parallel to the first substrate, respective ones of the plurality of first metal pad portions having a first upper surface exposed through the first upper insulating layer. The second upper insulating layer may include a plurality of second metal pad portions extending in a second direction different the first direction, respective ones of the plurality of second metal pad portions having a second upper surface exposed through the second upper insulating layer. The second upper surface of at least one of the plurality of second metal pad portions may contact a first upper surface of at least one of the plurality of first metal pad portions.

BRIEF DESCRIPTION OF THE DRAWINGS

The inventive concepts will become more apparent in view of the attached drawings and accompanying detailed description.

DETAILED DESCRIPTION

Figure 1:
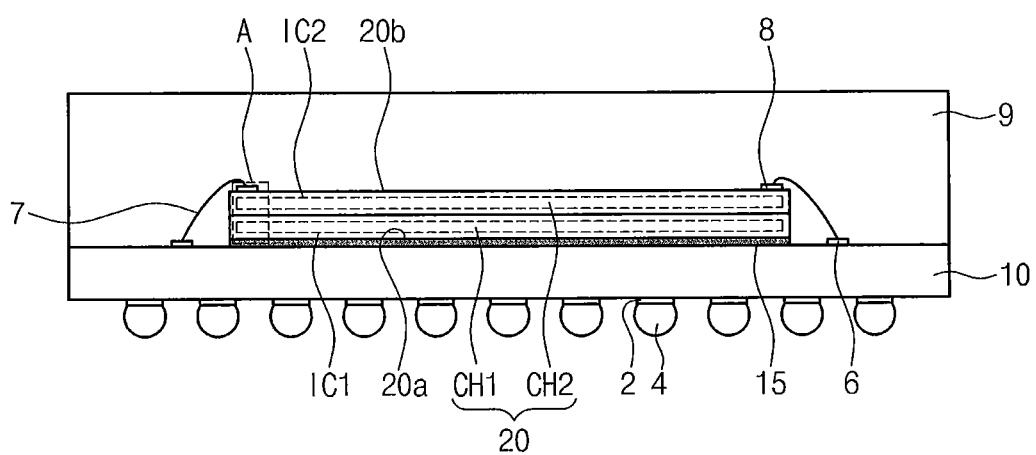
FIG. 1 is a cross-sectional view illustrating a semiconductor package according to some embodiments of the inventive concepts.

The inventive concepts will now be described more fully hereinafter with reference to the accompanying drawings, in which example embodiments of the inventive concepts are shown. The inventive concepts and methods of achieving them will be apparent from the following example embodiments that will be described in more detail with reference to the accompanying drawings. The embodiments of the inventive concepts may, however, be embodied in different forms and should not be constructed as limited to the embodiments set forth herein. Rather, these embodiments are provided so that this disclosure will be thorough and complete, and will fully convey the scope of the inventive concept to those skilled in the art.

As used herein, the singular terms "a," "an," and "the" are intended to include the plural forms as well, unless the context clearly indicates otherwise. It will be understood that when an element is referred to as being "connected" or "coupled" to another element, it may be directly connected or coupled to the other element or intervening elements may be present. As used herein, the term "and/or" includes any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Similarly, it will be understood that when an element such as a layer, region or substrate is referred to as being "on" another element, it can be directly on the other element or intervening elements may be present. In contrast, the term "directly" means that there are no intervening elements. Additionally, the embodiments in the detailed description will be described with sectional views as ideal example views of the inventive concepts. Accordingly, shapes of the example views may be modified according to manufacturing techniques and/or allowable errors. Therefore, the embodiments of the inventive concepts are not limited to the specific shape illustrated in the example views, but may include other shapes that may be created according to manufacturing processes.

Example embodiments of aspects of the present inventive concepts explained and illustrated herein include their complementary counterparts. The same reference numerals or the same reference designators denote the same elements throughout the specification.

While such terms as "first," "second," etc., may be used to describe various components, such components must not be limited to the above terms. The above terms are used only to distinguish one component from another. For example, a first component discussed below could be termed a second component, and similarly, a second component may be termed a first component without departing from the teachings of this disclosure.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The operations of all methods described herein can be performed in any suitable order unless otherwise indicated herein or otherwise clearly contradicted by context. The inventive concepts are not limited to the described order of the operations. For example, two consecutively described processes may be performed substantially at the same time or performed in an order opposite to the described order.

FIG. 1 is a cross-sectional view illustrating a semiconductor package according to some embodiments of the inventive concepts.

Referring to FIG. 1, a chip stack structure 20 may be mounted on a package substrate 10. For example, the package substrate 10 may be a printed circuit board (PCB). The package substrate 10 may include circuit patterns (not shown). A part of the circuit patterns may be electrically connected to first external connection pads 2 disposed on a bottom surface of the package substrate 10. External connection terminals 4 (e.g., solder bumps and/or solder balls) for electrically connecting the package substrate 10 to an external device may adhere to the first external connection pads 2, respectively. Some parts of the circuit patterns may be electrically connected to second external connection pads 6 disposed on a top surface of the package substrate 10.

The chip stack structure 20 may have a first surface 20a facing the package substrate 10 and a second surface 20b opposite to the first surface 20a. The first surface 20a of the chip stack structure 20 may be closer to the top surface of the package substrate 10 than the second surface 20b of the chip stack structure 20. In detail, the chip stack structure 20 may include a first semiconductor chip CH1 and a second semiconductor chip CH2 which are vertically stacked. The first and second semiconductor chips CH1 and CH2 may be physically and electrically coupled to each other by a wafer-level stacking method, thereby forming the chip stack structure 20. The first semiconductor chip CH1 may include a first integrated circuit IC1 formed therein, and the second semiconductor chip CH2 may include a second integrated circuit IC2 formed therein. The first and second semiconductor chips CH1 and CH2 will be described herein in more detail.

The chip stack structure 20 may be adhered to the package substrate 10 by an adhesive layer 15. The adhesive layer 15 may be disposed between the first surface 20a of the chip stack structure 20 and the top surface of the package substrate 10. The adhesive layer 15 may include an epoxy, a silicon-based insulating layer, and/or a tape.

Bonding pads 8 may be disposed on the second surface 20b of the chip stack structure 20. The bonding pads 8 may be electrically connected to the first and/or second integrated circuits IC1 and IC2. Wires 7 may electrically connect the bonding pads 8 of the chip stack structure 20 to the second external connection pads 6, respectively. The chip stack structure 20 may communicate with an external device (e.g., a controller, not shown) through the wires 7. Control signals (e.g., address signals and/or commands), a voltage signal, and/or data may be provided from the controller to the chip stack structure 20 through the wires 7.

A molding layer 9 may be disposed on the package substrate 10 to cover the chip stack structure 20 and the wires 7. The molding layer 9 may protect the chip stack structure 20 and the wires 7 from the external environment. The molding layer 9 may include, for example, an epoxy molding compound (EMC).

Figure 2:
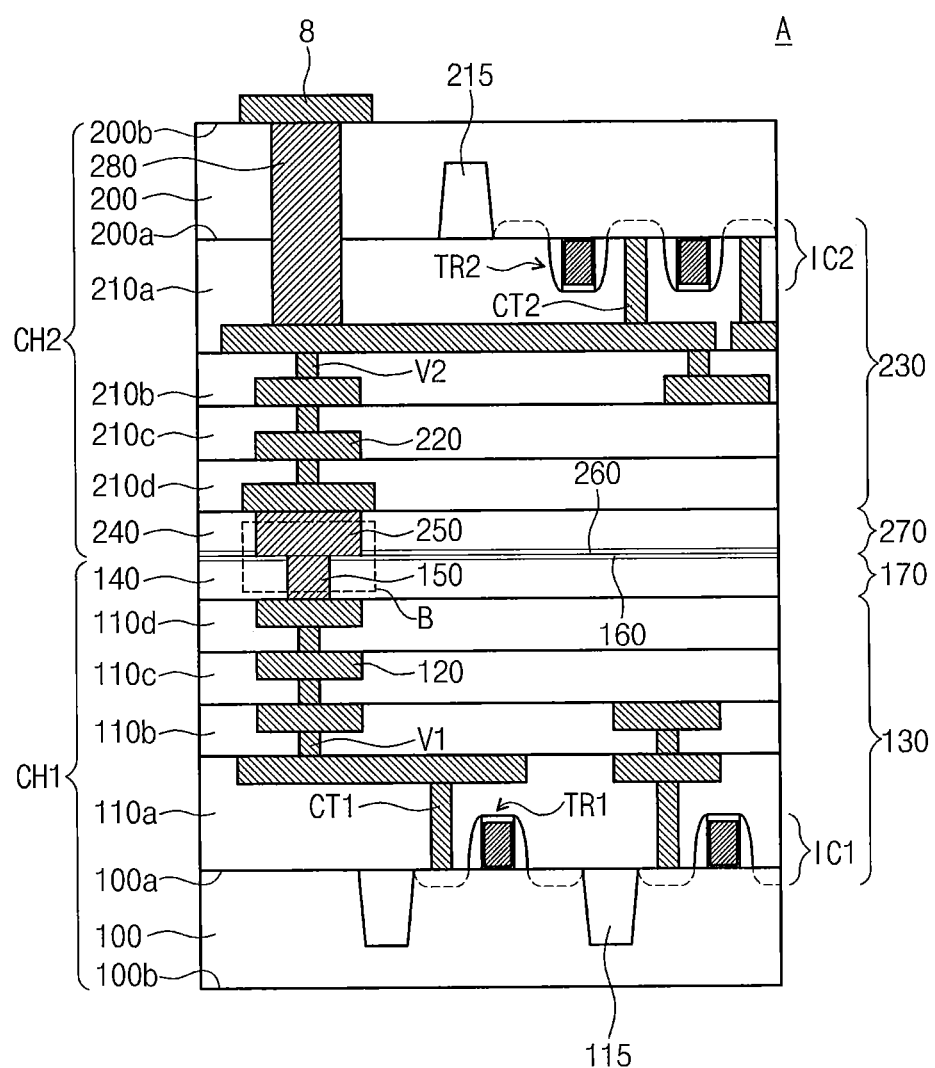
FIG. 2 is an enlarged cross-sectional view of portion 'A' of FIG. 1 illustrating a chip stack structure according to some embodiments of the inventive concepts.

FIG. 2 is an enlarged cross-sectional view of a portion 'A' of FIG. 1 illustrating a chip stack structure according to some embodiments of the inventive concepts.

Referring to FIGS. 1 and 2, the chip stack structure 20 may include the first semiconductor chip CH1 and the second semiconductor chip CH2. The first semiconductor chip CH1 and the second semiconductor chip CH2 may be vertically stacked and may be physically and electrically connected to each other. In some embodiments, a type of the first semiconductor chip CH1 may be different from that of the second semiconductor chip CH2. For example, the first semiconductor chip CH1 may be a logic chip, and the second semiconductor chip CH2 may be a memory chip such as a dynamic random access memory (DRAM) chip or a flash memory chip. In certain embodiments, the type of the first semiconductor chip CH1 may be the same as that of the second semiconductor chip CH2. For example, the first and second semiconductor chips CH1 and CH2 may be memory chips. However, embodiments of the inventive concepts are not limited thereto.

The first semiconductor chip CH1 may include a first substrate 100, a first circuit layer 130 on the first substrate 100, and a first connecting layer 170 on the first circuit layer 130. The first substrate 100 may be a semiconductor substrate. For example, the first substrate 100 may be a silicon substrate, a germanium substrate, and/or a silicon-germanium substrate. The first substrate 100 may have a front surface 100a and a back surface 100b opposite to the front surface 100a. The first circuit layer 130 may be disposed on the front surface 100a of the first substrate 100. In other words, the first circuit layer 130 may be closer to the front surface 100a of the first substrate 100 than the back surface 100b of the first substrate 100. The back surface 100b of the first substrate 100 may correspond to the first surface 20a of the chip stack structure 20 described with reference to FIG. 1.

The first circuit layer 130 may include the first integrated circuit IC1, a first interconnection structure, and first interlayer insulating layers 110a, 110b, 110c, and 110d covering the first integrated circuit IC1 and the first interconnection structure. The first interconnection structure may include first contacts CT1, first metal lines 120, and first vias V1. The first integrated circuit IC1 may be disposed adjacent the front surface 100a of the first substrate 100. The first integrated circuit IC1 may include a memory circuit, a logic circuit, or a combination thereof. For example, the first integrated circuit IC1 may include a plurality of first transistors TR1 constituting the memory circuit or the logic circuit. Each of the first transistors TR1 may include a gate electrode and dopant regions disposed at both sides of the gate electrode. The dopant regions may be disposed in the first substrate 100 and may be doped with dopants. In addition, first device isolation layers 115 formed in the first substrate 100 may be adjacent to the first transistors TR1. In some embodiments, the first transistors TR1 may have a planar gate structure illustrated in FIG. 2. However, embodiments of the inventive concepts are not limited thereto. In certain embodiments, the first transistors TR1 may be fin-type transistors.

The first interlayer insulating layers 110a, 110b, 110c, and 110d may be stacked on the front surface 100a of the first substrate 100. For example, each of the first interlayer insulating layers 110a, 110b, 110c, and 110d may include at least one of a silicon oxide layer, a silicon nitride layer, a silicon oxynitride layer, and/or a low-k dielectric layer having a lower dielectric constant than a silicon oxide layer. The first interlayer insulating layer 110a closest to the first substrate 100 of the first interlayer insulating layers 110a, 110b, 110c, and 110d may cover the first transistors TR1. At least one of the first contacts CT1 may penetrate the lowermost first interlayer insulating layer 110a so as to be connected to one of the dopant regions of the first transistors TR1. The first metal lines 120 may be disposed in the first interlayer insulating layers 110a, 110b, 110c, and 110d. The first metal lines 120 may be electrically connected to each other through the first vias V1. For example, the first contacts CT1, the first metal lines 120, and the first vias V1 may include a metal such as copper or tungsten. Though FIG. 2 illustrates four first interlayer insulating layers 110a, 110b, 110c, and 110d, the inventive concepts are not limited thereto. Embodiments of the inventive concepts may include more or fewer first interlayer insulating layers without deviating from the scope and spirit of the inventive concepts.

Even though not shown in the drawings, at least one first metal diffusion barrier layer (not shown) may be disposed in the first interlayer insulating layers 110a, 110b, 110c, and 110d. The first metal diffusion barrier layer may include SiN, SiCN, SiOCN, SiON, or SiC. The first metal diffusion barrier layer may prevent diffusion of metal atoms of the first metal lines 120 and the first vias V1 disposed in the first interlayer insulating layers 110a, 110b, 110c, and 110d.

The first connecting layer 170 may include a first upper insulating layer 140, a first metal pad 150, and a first bonding insulating layer 160. The first upper insulating layer 140 may be disposed on the first interlayer insulating layer 110d furthest from the first substrate 100. The first upper insulating layer 140 may include a silicon oxide layer and/or a low-k insulating layer (e.g., a SiCOH layer and/or a SiOF layer). The first metal pad 150 may be disposed in the first upper insulating layer 140. In other words, the first upper insulating layer 140 may surround the first metal pad 150. In addition, the first metal pad 150 may penetrate the first upper insulating layer 140 so as to be connected to at least one of the first metal lines 120. For example, the first metal pad 150 may be connected directly to the first metal line 120 disposed in the first interlayer insulating layer 110d. Thus, the first metal pad 150 may be electrically connected to the first integrated circuit IC1 through the first metal lines 120, the first vias V1, and the first contacts CT1. The first metal pad 150 may include copper, tungsten, aluminum, silver, or any alloy thereof. The first metal pad 150 will be described herein in more detail.

The first bonding insulating layer 160 may be disposed on the first upper insulating layer 140. The first bonding insulating layer 160 may cover a top surface of the first upper insulating layer 140 and may expose the first metal pad 150. The first bonding insulating layer 160 may include the same material as the first metal diffusion barrier layer. For example, the first bonding insulating layer 160 may include SiN, SiCN, SiOCN, SiON, and/or SiC. The first bonding insulating layer 160 may prevent metal atoms of the first metal pad 150 from being diffused.

The second semiconductor chip CH2 may have the same or similar structure as the first semiconductor chip CH1. In some embodiments, the second semiconductor chip CH2 may include a second substrate 200, a second circuit layer 230 on the second substrate 200, and a second connecting layer 270 on the second circuit layer 230. The second substrate 200 may be a semiconductor substrate. For example, the second substrate 200 may be a silicon substrate, a germanium substrate, and/or a silicon-germanium substrate. The second substrate 200 may have a front surface 200a and a back surface 200b opposite to each other. The second circuit layer 230 may be disposed on the front surface 200a of the second substrate 200. In other words, the second circuit layer 230 may be closer to the front surface 200a of the second substrate 200 than the back surface 200b of the second substrate 200. The back surface 200b of the second substrate 200 may correspond to the second surface 20b of the chip stack structure 20 described with reference to FIG. 1.

The second circuit layer 230 may include the second integrated circuit IC2, a second interconnection structure, and second interlayer insulating layers 210a, 210b, 210c, and 210d covering the second integrated circuit IC2 and the second interconnection structure. The second interconnection structure may include second contacts CT2, second metal lines 220, and second vias V2. The second integrated circuit IC2 may be disposed to be adjacent to the front surface 200a of the second substrate 200. The second integrated circuit IC2 may include a memory circuit, a logic circuit, or a combination thereof. For example, the second integrated circuit IC2 may include a plurality of second transistors TR2 constituting the memory circuit or the logic circuit. Each of the second transistors TR2 may include a gate electrode and dopant regions disposed at both sides of the gate electrode. The dopant regions may be disposed in the second substrate 200 and may be doped with dopants. In addition, second device isolation layers 215 formed in the second substrate 200 may be adjacent to the second transistors TR2. In some embodiments, the second transistors TR2 may have a planar gate structure illustrated in FIG. 2. However, embodiments of the inventive concepts are not limited thereto. In certain embodiments, the second transistors TR2 may be fin-type transistors. Though FIG. 2 illustrates four second interlayer insulating layers 210a, 210b, 210c, and 210d, the inventive concepts are not limited thereto. Embodiments of the inventive concepts may include more or fewer second interlayer insulating layers without deviating from the scope and spirit of the inventive concepts.

The second interlayer insulating layers 210a, 210b, 210c, and 210d may be stacked on the front surface 200a of the second substrate 200. For example, each of the second interlayer insulating layers 210a, 210b, 210c, and 210d may include at least one of a silicon oxide layer, a silicon nitride layer, a silicon oxynitride layer, and/or a low-k dielectric layer having a lower dielectric constant than a silicon oxide layer. The second interlayer insulating layer 210a nearest to the second substrate 200 may cover the second transistors TR2. At least one of the second contacts CT2 may penetrate the second interlayer insulating layer 210a so as to be connected to one of the dopant regions of the second transistors TR2. The second metal lines 220 may be disposed in the second interlayer insulating layers 210a, 210b, 210c, and 210d. The second metal lines 220 may be electrically connected to each other through the second vias V2. For example, the second contacts CT2, the second metal lines 220, and the second vias V2 may include a metal such as copper or tungsten.

Even though not shown in the drawings, at least one second metal diffusion barrier layer (not shown) may be disposed in the second interlayer insulating layers 210a, 210b, 210c, and 210d. The second metal diffusion barrier layer may include SiN, SiCN, SiOCN, SiON, and/or SiC. The second metal diffusion barrier layer may prevent diffusion of metal atoms of the second metal lines 220 and the second vias V2 disposed in the second interlayer insulating layers 210a, 210b, 210c, and 210d.

The second connecting layer 270 may include a second upper insulating layer 240, a second metal pad 250, and a second bonding insulating layer 260. The second upper insulating layer 240 may be disposed on the second interlayer insulating layer 210d furthest from the second substrate 200. The second upper insulating layer 240 may include a silicon oxide layer and/or a low-k insulating layer (e.g., a SiCOH layer and/or a SiOF layer). The second metal pad 250 may be disposed in the second upper insulating layer 240. In other words, the second upper insulating layer 240 may surround the second metal pad 250. In addition, the second metal pad 250 may penetrate the second upper insulating layer 240 so as to be connected to at least one of the second metal lines 220. For example, the second metal pad 250 may be connected directly to the second metal line 220 disposed in the second interlayer insulating layer 210d. Thus, the second metal pad 250 may be electrically connected to the second integrated circuit IC2 through the second metal lines 220, the second vias V2, and the second contacts CT2. The second metal pad 250 may include copper, tungsten, aluminum, silver, or any alloy thereof. The second metal pad 250 will be described herein in more detail.

The second bonding insulating layer 260 may be disposed on the second upper insulating layer 240. The second bonding insulating layer 260 may cover a surface of the second upper insulating layer 240 furthest from the second substrate 200 and may expose the second metal pad 250. The second bonding insulating layer 260 may include the same material as the second metal diffusion barrier layer. For example, the second bonding insulating layer 260 may include SiN, SiCN, SiOCN, SiON, and/or SiC. The second bonding insulating layer 260 may prevent metal atoms of the second metal pad 250 from being diffused.

The second semiconductor chip CH2 may include at least one through-via 280 penetrating the second substrate 200. The through-via 280 may penetrate both the back surface 200b and the front surface 200a of the second substrate 200. In addition, the through-via 280 may further penetrate a portion (e.g., the second interlayer insulating layer 210a) of the second interlayer insulating layers 210a, 210b, 210c, and/or 210d so as to be connected to at least one of the second metal lines 220. The through-via 280 may include a metal such as copper (Cu) and/or tungsten (W). Input/output (I/O) signals applied through the through-via 280 from an external device (not shown) may be transmitted to the second metal pad 250 through the second metal lines 220 and the second vias V2.

The second semiconductor chip CH2 may be overturned and located on the first semiconductor chip CH1, and thus the front surface 100a of the first substrate 100 may face the front surface 200a of the second substrate 200. In other words, the first connecting layer 170 and the second connecting layer 270 may face each other. The first connecting layer 170 and the second connecting layer 270 may be physically and/or electrically connected to each other, and thus the first semiconductor chip CH1 may be coupled to the second semiconductor chip CH2. In detail, the first metal pad 150 and the second metal pad 250 may be aligned with each other and may be in physical and/or electrical contact with each other. Thus, the first semiconductor chip CH1 may be electrically connected to the second semiconductor chip CH2. The first bonding insulating layer 160 may be in direct contact with the second bonding insulating layer 260. As a result, in some embodiments the first semiconductor chip CH1 may be in direct contact with, and coupled to, the second semiconductor chip CH2 without a connecting medium such as a solder ball or a solder bump. According to some embodiments of the inventive concepts, the first and second metal pads 150 and 250 may have structures capable of minimizing an influence of misalignment and of forming a bonding surface having a constant area therebetween when the first and second semiconductor chips CH1 and CH2 are coupled or bonded to each other. In addition, the first and second metal pads 150 and 250 may have structures capable of realizing a reliable and stable electrical connection therebetween. Hereafter, the structures of the first and second metal pads 150 and 250 will be described in detail.

Figure 3:
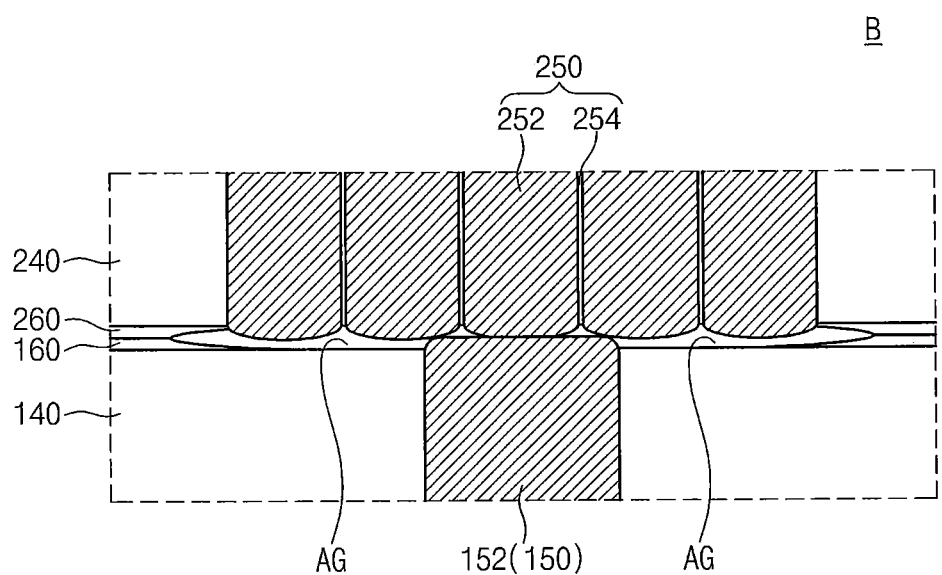
FIG. 3 is an enlarged cross-sectional view of portion 'B' of FIG. 2 illustrating first and second metal pads according to some embodiments of the inventive concepts.
Figure 4A:
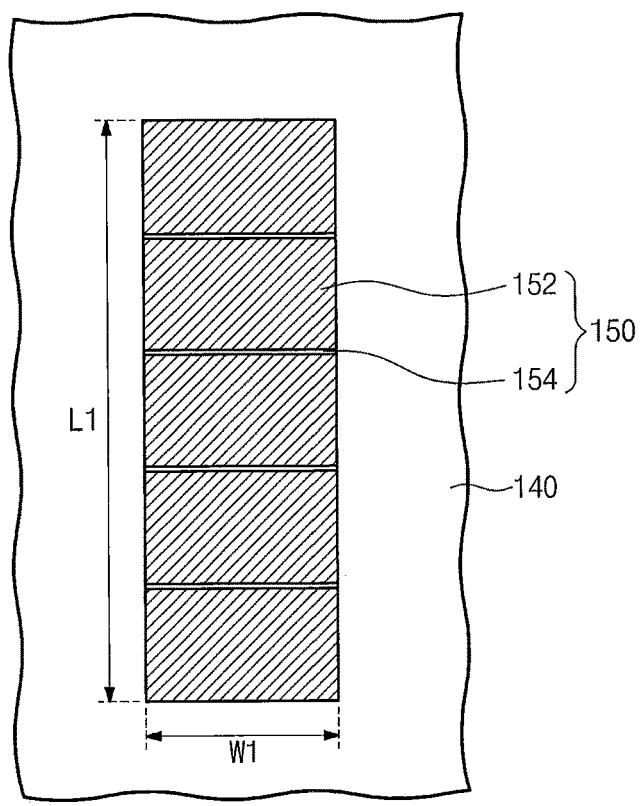
FIGS. 4A and 4B are plan views illustrating the first metal pad and the second metal pad of FIG. 3, respectively.
Figure 4B:
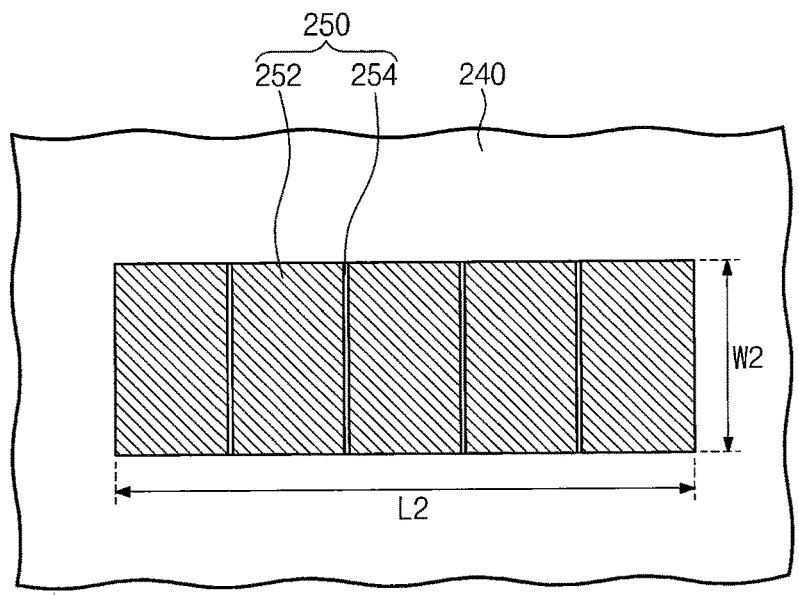
Figure 5A:
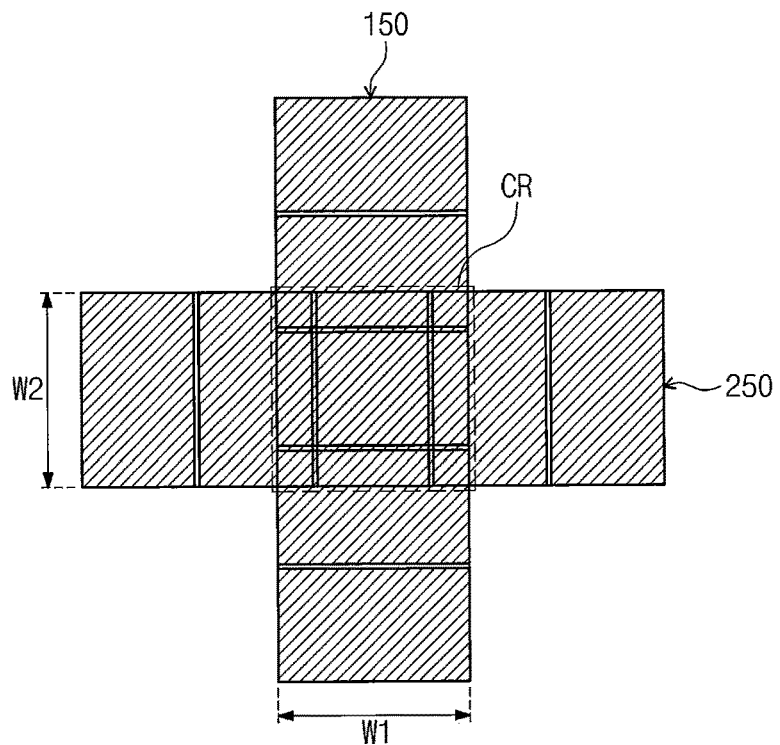
FIGS. 5A and 5B are plan views illustrating a state in which the first and second metal pads of FIG. 3 are bonded to each other.
Figure 5B:
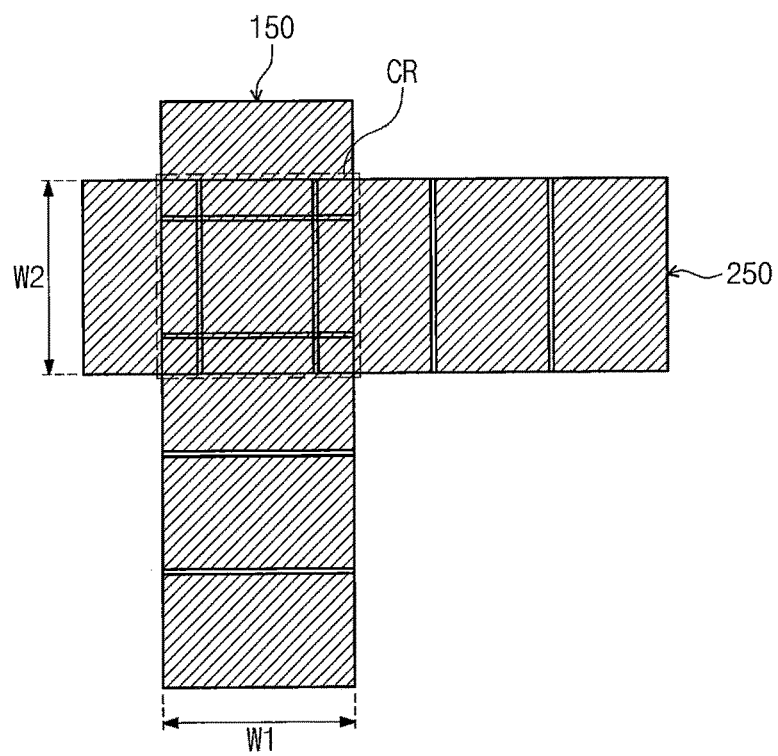
Figure 6A:
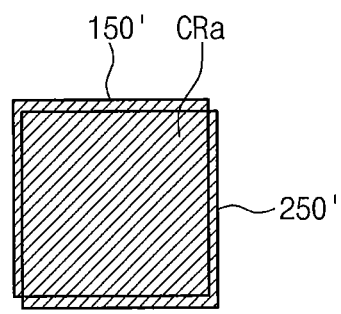
FIGS. 6A and 6B are plan views illustrating a state in which first and second metal pads according to a comparative example are bonded to each other.
Figure 6B:
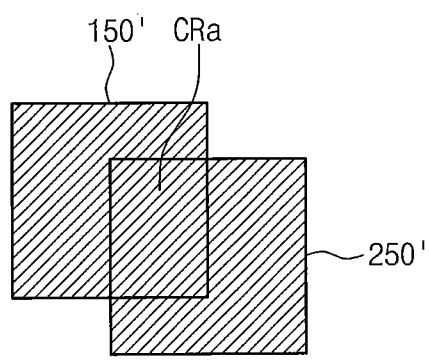

FIG. 3 is an enlarged cross-sectional view of a portion 'B' of FIG. 2 illustrating first and second metal pads according to some embodiments of the inventive concepts. FIGS. 4A and 4B are plan views illustrating the first metal pad and the second metal pad of FIG. 3, respectively. FIGS. 5A and 5B are plan views illustrating a state in which the first and second metal pads of FIG. 3 are bonded to each other. FIGS. 6A and 6B are plan views illustrating a state in which first and second metal pads according to a comparative example are bonded to each other.

Referring to FIGS. 3, 4A, and 4B, the first metal pad 150 may have a rectangular shape when viewed from a plan view. In other words, the first metal pad 150 may have a first length L1 in a long-axis direction (i.e. an axis of the longest dimension of the first metal pad 150) and a first width W1 in a short-axis direction (i.e. an axis of the shortest dimension of the first metal pad 150). In some embodiments, a ratio (L1/W1) of the first length L1 to the first width W1 may be equal to or greater than 2. In particular, the ratio (L1/W1) of the first length L1 to the first width W1 may range from about 2 to about 4. However, embodiments of the inventive concepts are not limited thereto. In addition, the first metal pad 150 may include a plurality of first metal pad portions 152 and first partitions 154. As used herein, a metal pad portion may be a selective portion, or sub-pad, of the metal pads. In detail, the first metal pad portions 152 may be arranged in the long-axis direction (i.e., a longitudinal direction) of the first metal pad 150, and the first partitions 154 may be disposed between the first metal pad portions 152. In other words, each of the first partitions 154 may be disposed between the first metal pad portions 152 adjacent each other. In some embodiments, each of the first partitions 154 may have both ends opposite to each other in the short-axis direction of the first metal pad 150 when viewed from a plan view. The both ends of each of the first partitions 154 may be connected to the first upper insulating layer 140, as illustrated in FIG. 4A. As a result, the first metal pad 150 may have the structure in which the plurality of first metal pad portions 152 are separated from each other by the first partitions 154. In other words, the first metal pad portions 152 may be spaced apart from and insulated from each other by the first partitions 154.

According to some embodiments of the inventive concepts, the number of the first partitions 154 may be two or more. In addition, the number of the first metal pad portions 152 may be equal to a value obtained by adding one to the number of the first partitions 154. In other words, there may be three or more of the first metal pad portions 152. In some embodiments, the first metal pad 150 may include four first partitions 154 and five first metal pad portions 152, as illustrated in FIG. 4A. However, embodiments of the inventive concepts are not limited thereto. The first partitions 154 may include the same or similar material as the first upper insulating layer 140. For example, the first partitions 154 may include silicon oxide or a low-k insulating material (e.g., SiCOH and/or SiOF). The first metal pad portions 152 may protrude upward from top surfaces of the first partitions 154 or a top surface of the first upper insulating layer 140 toward the second substrate 200. For example, the first metal pad portions 152 may include copper, tungsten, aluminum, silver, or any alloy thereof.

The second metal pad 250 may have the same or similar structure as the first metal pad 150. For example, the second metal pad 250 may have a rectangular shape when viewed from a plan view. The second metal pad 250 may have a second length L2 in a long-axis direction of the second metal pad 250 (i.e. an axis of the longest dimension of the second metal pad 250) and a second width W2 in a short-axis direction of the second metal pad 250 (i.e. an axis of the shortest dimension of the second metal pad 250) when viewed from a plan view. In some embodiments, the second length L2 and the second width W2 may be substantially equal to the first length L1 and the first width W1, respectively. However, embodiments of the inventive concepts are not limited thereto. As with the first metal pad 150, a ratio (L2/W2) of the second length L2 to the second width W2 may be equal to or greater than 2. In particular, the ratio (L2/W2) of the second length L2 to the second width W2 may range from about 2 to about 4. However, embodiments of the inventive concepts are not limited thereto.

In addition, the second metal pad 250 may include a plurality of second metal pad portions 252 and second partitions 254. In other words, like the first metal pad 150, the second metal pad 250 may have a structure in which the plurality of second metal pad portions 252 are separated from each other by the second partitions 254. For example, the second metal pad portions 252 may be arranged in the long-axis direction (i.e., a longitudinal direction) of the second metal pad 250, and the second partitions 254 may be disposed between the second metal pad portions 252. In some embodiments, each of the second partitions 254 may have both ends opposite to each other in the short-axis direction of the second metal pad 250 when viewed from a plan view. The both ends of each of the second partitions 254 may be connected to the second upper insulating layer 240, as illustrated in FIG. 4B. Thus, the second metal pad portions 252 may be spaced apart from and insulated from each other by the second partitions 254.

The number of the second partitions 254 may be two or more like the first partitions 154, and thus the number of the second metal pad portions 252 may be three or more. In some embodiments, the number of the second partitions 254 may be four and the number of the second metal pad portions 252 may be five, as illustrated in FIG. 4B. However, embodiments of the inventive concepts are not limited thereto. The numbers of the second partitions 254 and the second metal pad portions 252 may be variously modified. In some embodiments, the number of the second partitions 254 and the number of the second metal pad portions 252 may be different from the number of the first partitions 154 and the number of the first metal pad portions 152, respectively. The second partitions 254 may include the same or similar material as the second upper insulating layer 240. For example, the second partitions 254 may include silicon oxide and/or a low-k insulating material. The second metal pad portions 252 may protrude from top surfaces (i.e., surfaces adjacent to the first substrate 100) of the second partitions 254 or a top surface (i.e., a surface adjacent to the first substrate 100) of the second upper insulating layer 240 toward the first substrate 100. For example, the second metal pad portions 252 may include copper, tungsten, aluminum, silver, or any alloy thereof.

As illustrated in FIGS. 5A and 5B, the first metal pad 150 and the second metal pad 250 may be disposed to intersect each other. In other words, the second metal pad 250 may intersect the first metal pad 150 when viewed from a plan view. Stated another way, the long-axis of the first metal pad 150 may extend in a first direction and the long-axis of the second metal pad 250 may extend in a second direction that is substantially perpendicular to the first direction. The first metal pad portions 152 may be in contact with the second metal pad portions 252 in an intersecting or overlapping region CR of the first metal pad 150 and the second metal pad 250. According to some embodiments of the inventive concepts, since each of the first and second metal pads 150 and 250 has the rectangular planar shape of which a ratio of a long axis to a short axis is 2 or more, an influence of misalignment may be minimized and a substantially constant area of the intersecting region CR may be secured. For example, when the first and second metal pads 150 and 250 are badly aligned with each other (e.g., an embodiment similar to that of FIG. 5B) as well as when the first and second metal pads 150 and 250 are well aligned with each other (e.g., an embodiment similar to that of FIG. 5A), the intersecting region CR of the first and second metal pads 150 and 250 may have an area obtained by multiplying the first width W1 by the second width W2. As a result, a substantially constant bonding area between the first and second metal pad portions 152 and 252 may be obtained in the intersecting region CR of the first and second metal pads 150 and 250. In contrast, as illustrated in FIG. 6A and 6B, if the first and second metal pads 150' and 250' have square planar shapes or similar planar shapes thereto, an area of an overlapping region CRa between the first and second metal pads 150' and 250' in a state of good alignment (e.g. FIG. 6A) may be very different from an area of an overlapping region CRa between the first and second metal pads 150' and 250' in a state of bad alignment (e.g. FIG. 6B). In other words, in embodiments not benefitting from the inventive concepts, it may be difficult to obtain a constant bonding area between the first and second metal pads 150' and 250'. When the first and second metal pads 150' and 250' are bonded to each other by a wafer-level stacking method, variation of the bonding area between the first and second metal pads 150' and 250' due to misalignment may be increased.

In general, the bonding of the first and second metal pads 150' and 250' may be performed by a high-temperature and/or high-pressure process. At this time, a metal element (e.g., copper) of the first and second metal pads 150' and 250' may be migrated, and thus surface profiles of the first and second metal pads 150' and 250' may be varied. This may cause contact failure between the first and second metal pads 150' and 250'.

According to some embodiments of the inventive concepts, the first and second partitions 154 and 254 may limit the migration of the metal element in the first and second metal pads 150 and 250 when the first and second metal pads 150 and 250 are bonded to each other, and thus it is possible to prevent or reduce the contact failure between the first and second metal pads 150 and 250 which may be caused by variation of the surface profiles. This will be described herein in more detail in a process of bonding the first and second metal pads 150 and 250 to each other.

Because the first and second metal pads 150 and 250 include the first and second metal pad portions 152 and 252 separated from each other by the first and second partitions 154 and 254, the first and second metal pads 150 and 250 may have a substantially constant bonding area and may be reliably and stably coupled to each other. In other words, it is possible to improve electrical characteristics and reliability of the chip stack structure 20 in which the first and second semiconductor chips CH1 and CH2 are stacked and are coupled to each other.

In some embodiments, as illustrated in FIG. 3, portions of the first and second bonding insulating layers 160 and 260 adjacent to the first and second metal pad portions 152 and 252 may be recessed. Thus, an air gap AG may be provided between one metal pad (e.g., the second metal pad 250) and one bonding insulating layer (e.g., the first bonding insulating layer 160) facing the one metal pad. Here, the air gap AG may correspond to a region in which a solid material is not provided. In other words, the air gap AG may be a substantially empty space.

A method of manufacturing a chip stack structure according to some embodiments of the inventive concepts will be described hereinafter. FIGS. 7, 8, 10, and 12 are cross-sectional views illustrating methods of manufacturing chip stack structures according to some embodiments of the inventive concepts. FIGS. 9A to 9D are partial cross-sectional views illustrating methods of forming metal pads according to some embodiments of the inventive concepts. FIGS. 11A and 11B are enlarged cross-sectional views of a portion 13' of FIG. 10. Hereinafter, the same descriptions as explained above will be omitted or mentioned briefly for the purpose of ease and convenience in explanation.

Figure 7:
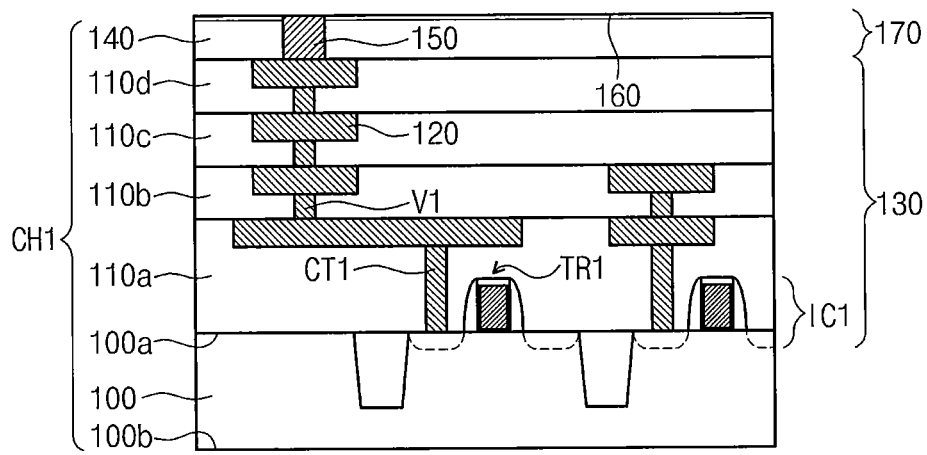
FIGS. 7, 8, 10, and 12 are cross-sectional views illustrating methods of manufacturing chip stack structures according to some embodiments of the inventive concepts.

Referring to FIG. 7, a first semiconductor chip CH1 may be provided. In detail, a first integrated circuit IC1 may be formed on a front surface 100a of a first substrate 100. Here, the front surface 100a of the first substrate 100 may be an active surface, and a back surface 100b of the first substrate 100 opposite to the front surface 100a may be a non-active surface. The first integrated circuit IC1 may include a plurality of first transistors TR1. The first transistors TR1 may constitute a memory circuit or a logic circuit. Subsequently, first interlayer insulating layers 110a, 110b, 110c, and 110d may be formed to cover the first integrated circuit IC1. At this time, a first interconnection structure including first contacts CT1, first vias V1, and first metal lines 120 may be formed in the first interlayer insulating layers 110a, 110b, 110c, and 110d. In some embodiments, the first vias V1 and the first metal lines 120 may be formed using a damascene process. The first integrated circuit IC1, the first interconnection structure, and the first interlayer insulating layers 110a, 110b, 110c, and 110d may constitute a first circuit layer 130. Though FIG. 7 illustrates four first interlayer insulating layers 110a, 110b, 110c, and 110d, the inventive concepts are not limited thereto. Embodiments of the inventive concepts may include more or fewer first interlayer insulating layers without deviating from the scope and spirit of the inventive concepts.

A first connecting layer 170 may be formed on the first circuit layer 130. The first connecting layer 170 may include a first upper insulating layer 140 disposed on the first interlayer insulating layer 110d of the first interlayer insulating layers 110a, 110b, 110c, and 110d that is furthest from the first substrate 100, a first metal pad 150 disposed in the first upper insulating layer 140, and a first bonding insulating layer 160 covering a top surface of the first upper insulating layer 140 and exposing the first metal pad 150. The first metal pad 150 may include a plurality of first metal pad portions 152 and first partitions 154, as described with reference to FIGS. 3 and 4A. A method of forming the first metal pad 150 may be substantially the same as a method of forming a second metal pad 250 to be described herein. Thus, in some embodiments the detailed method of forming the first metal pad 150 may be replaced with the method of forming the second metal pad 250 to be described later.

Figure 8:
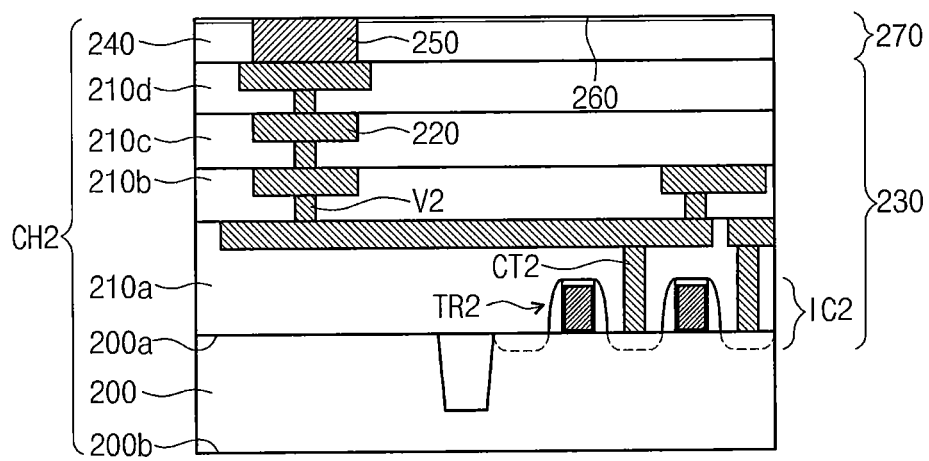

Referring to FIG. 8, a second semiconductor chip CH2 may be provided. In detail, a second integrated circuit IC2 may be formed on a front surface 200a of a second substrate 200. Here, the front surface 200a of the second substrate 200 may be an active surface, and a back surface 200b of the second substrate 200 opposite to the front surface 200a may be a non-active surface. The second integrated circuit IC2 may include a plurality of second transistors TR2. The second transistors TR2 may constitute a memory circuit or a logic circuit. Subsequently, second interlayer insulating layers 210a, 210b, 210c, and 210d may be formed to cover the second integrated circuit IC2. At this time, a second interconnection structure including second contacts CT2, second vias V2, and second metal lines 220 may be formed in the second interlayer insulating layers 210a, 210b, 210c, and 210d. In some embodiments, the second vias V2 and the second metal lines 220 may be formed using a damascene process. The second integrated circuit IC2, the second interconnection structure, and the second interlayer insulating layers 210a, 210b, 210c, and 210d may constitute a second circuit layer 230. Though FIG. 8 illustrates four second interlayer insulating layers 210a, 210b, 210c, and 210d, the inventive concepts are not limited thereto. Embodiments of the inventive concepts may include more or fewer second interlayer insulating layers without deviating from the scope and spirit of the inventive concepts.

A second connecting layer 270 may be formed on the second circuit layer 230. The second connecting layer 270 may include a second upper insulating layer 240 disposed on the second interlayer insulating layer 210d of the second interlayer insulating layers 210a, 210b, 210c, and 210d that is furthest from the second substrate 200, a second metal pad 250 disposed in the second upper insulating layer 240, and a second bonding insulating layer 260 covering a top surface of the second upper insulating layer 240 and exposing the second metal pad 250. The second metal pad 250 may include a plurality of second metal pad portions 252 and second partitions 254, as described with reference to FIGS. 3 and 4B. Hereinafter, the method of forming the second metal pad 250 will be described in detail with reference to FIGS. 9A to 9D.

Figure 9A:
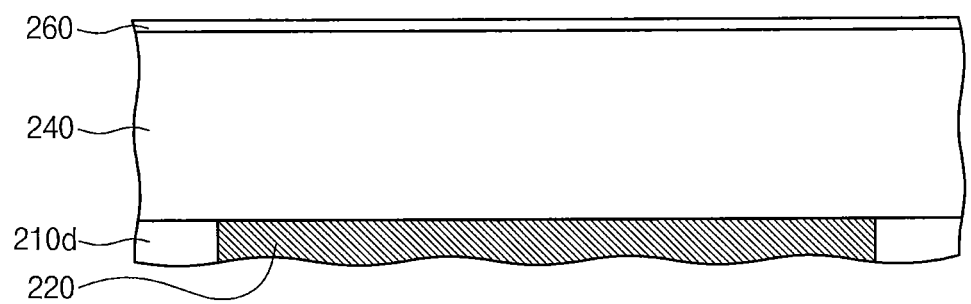
FIGS. 9A to 9D are partial cross-sectional views illustrating methods of forming metal pads according to some embodiments of the inventive concepts.

Referring to FIG. 9A, the second upper insulating layer 240 and the second bonding insulating layer 260 may be sequentially formed on the second interlayer insulating layer 210d furthest from the second substrate 200. The second upper insulating layer 240 may cover a top surface of the second metal line 220 disposed in the second interlayer insulating layer 210d.

Figure 9B:
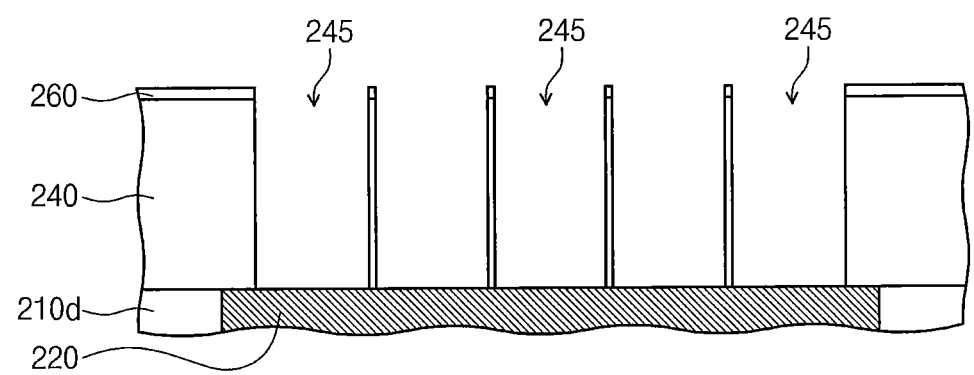

Referring to FIG. 9B, a plurality of openings 245 may be formed in the second upper insulating layer 240. The plurality of openings 245 may penetrate the second upper insulating layer 240 to expose the top surface of the second metal line 220 disposed in the second interlayer insulating layer 210d. Forming the plurality of openings 245 may include forming a mask pattern (not shown) on the second upper insulating layer 240 and the second bonding insulating layer 260, and etching the second upper insulating layer 240 and the second bonding insulating layer 260 using the mask pattern as an etch mask.

Figure 9C:
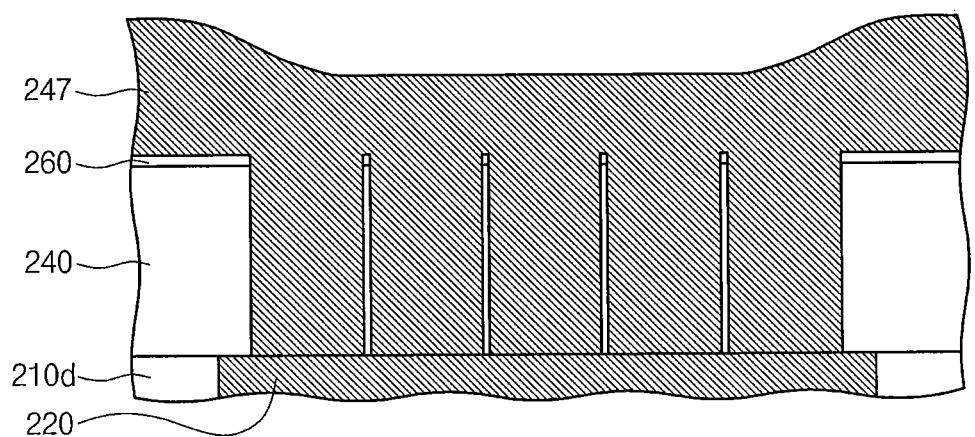

Referring to FIG. 9C, a metal layer 247 may be formed in the plurality of openings 245. The metal layer 247 may fill the plurality of openings 245 and may cover a top surface of the second bonding insulating layer 260. For example, the metal layer 247 may include copper, tungsten, aluminum, silver, or any alloy thereof.

Figure 9D:
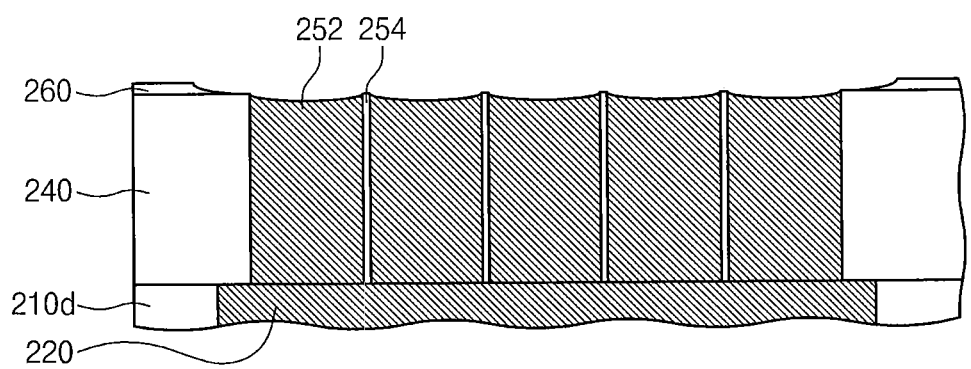

Referring to FIG. 9D, a planarization process may be performed on the metal layer 247 to form a plurality of the second metal pad portions 252 in the plurality of openings 245, respectively. For example, the planarization process may include a chemical mechanical polishing (CMP) process. When the planarization process (e.g., the CMP process) is performed on the metal layer 247, the second bonding insulating layer 260 may be used as a polishing stop layer. Portions of the second upper insulating layer 240, each of which is disposed between the second metal pad portions 252 adjacent to each other, may be defined as the second partitions 254. Meanwhile, due to a dishing phenomenon of the CMP process, a top surface of at least one of the second metal pad portions 252 may be disposed at a lower height (or level) with respect to the front surface 200a of the second substrate 200 than the top surface of the second bonding insulating layer 260 and may have a concave shape toward the second substrate 200. As used herein, the height (or level) of a first surface with respect to a second surface may be defined as a vertical distance from the second surface to the first surface. In some embodiments, the planarization process may form a recess in top surfaces of the second metal pad portions 252. Similar features may also result in the first metal pad portions 152 as a result of similar processing. In other words, a top surface of at least one of the first metal pad portions 152 may be disposed at a lower height (or level) with respect to the front surface 100a of the first substrate 100 than a top surface of the first bonding insulating layer 160 and may have a concave shape toward the first substrate 100. In addition, a portion of the second bonding insulating layer 260 adjacent to the second metal pad portions 252 may be recessed by erosion according to the CMP process. Likewise, a portion of the first bonding insulating layer 160 adjacent to the first metal pad portions 152 may be recessed by erosion according to a CMP process. In some embodiments, unlike FIG. 9D, portions of the second bonding insulating layer 260 may remain on top surfaces of the second partitions 254 after the CMP process. Similarly, in some embodiments, portions of the first bonding insulating layer 160 may remain on top surfaces of the first partitions 154 after the CMP process.

Though the description provided herein describes the formation of the first metal pad 150 and the second metal pad 250 as being performed similarly, in some embodiments the layout of the first metal pad 150 and the second metal pad 250 may be different. In other words, though the process used to form the first metal pad 150 in the first connecting layer 170 may be similar to that used to form the second metal pad 250 in the second connecting layer 270, the disposition of the first metal pad 150 in the first connecting layer 170 may be different than that of the second metal pad 250 in the second connecting layer 270. For example, in some embodiments, the first metal pad 150 may be formed to extend in a first direction within the first connecting layer 170, while the second metal pad 250 may be formed to extend in a second direction, substantially perpendicular to the first direction, within the second connecting layer 270.

Figure 10:
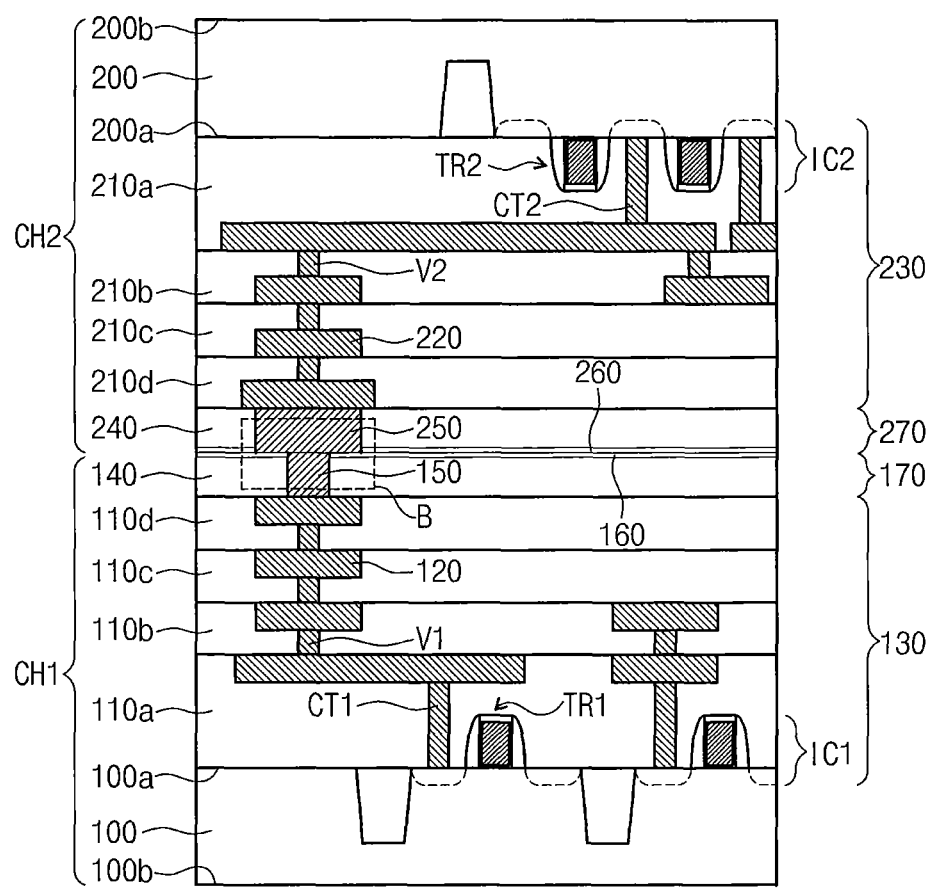
Figure 11A:
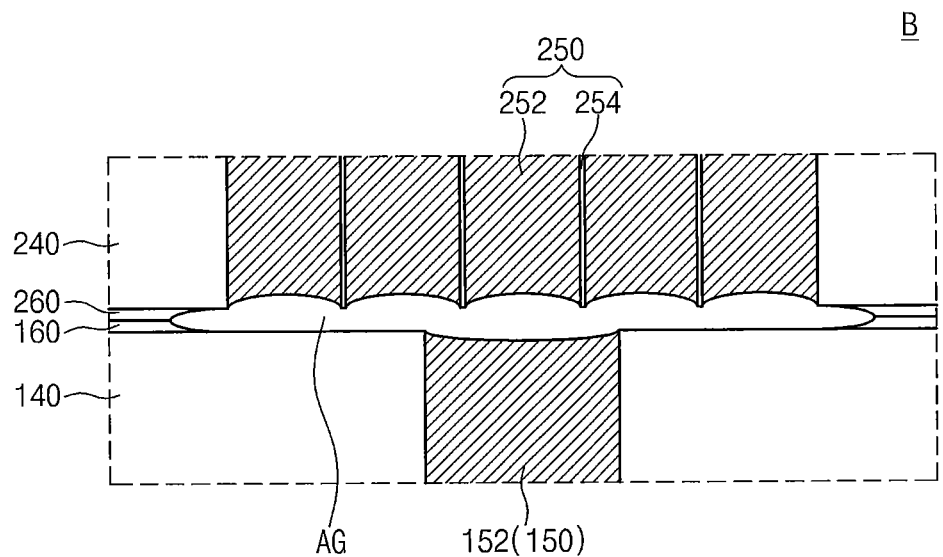
FIGS. 11A and 11B are enlarged cross-sectional views of portion 'B' of FIG. 10.
Figure 11B:
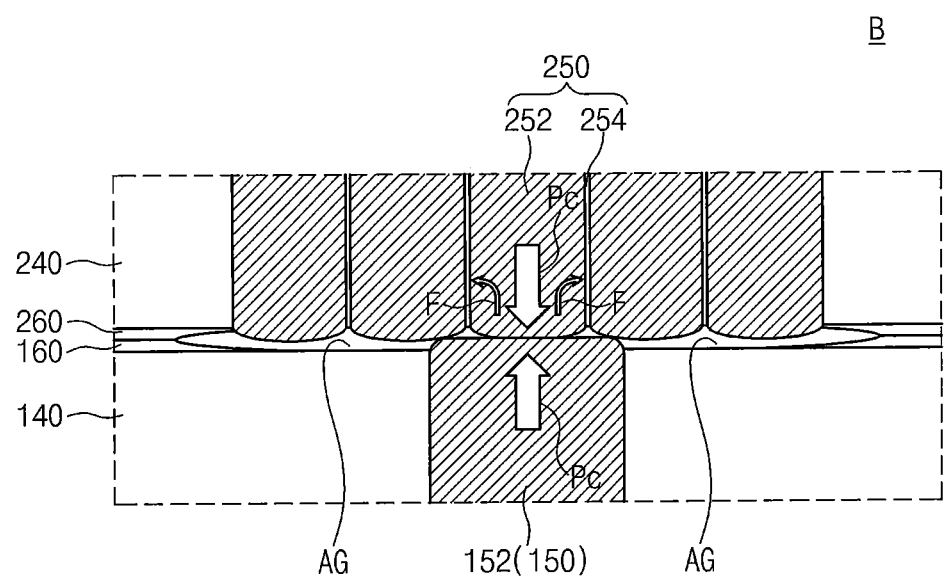

Referring to FIG. 10, the first and second semiconductor chips CH1 and CH2 may be stacked in such a way that the front surface 100a of the first substrate 100 faces the front surface 200a of the second substrate 200. In other words, the second semiconductor chip CH2 may be overturned and then be located on the first semiconductor chip CH1. Thus, the first connecting layer 170 and the second connecting layer 270 may face each other and may be in contact with each other. At this time, the first metal pad 150 and the second metal pad 250 may be aligned to intersect each other. Thereafter, a bonding process (e.g., a thermal treatment process) may be performed at high temperature and/or high pressure to firmly bond the first connecting layer 170 and the second connecting layer 270 to each other. In other words, the first bonding insulating layer 160 of the first semiconductor chip CH1 and the second bonding insulating layer 260 of the second semiconductor chip CH2 may be in direct contact with each other and may be firmly bonded to each other. In addition, the first metal pad portions 152 may be in direct contact with and be physically and/or electrically connected to the second metal pad portions 252 in an intersecting region of the first and second metal pads 150 and 250.

The upper portions of the first and second metal pad portions 152 and 252 and the portions of the first and second bonding insulating layers 160 and 260 adjacent to the first and second metal pad portions 152 and 252 may be recessed by the dishing or erosion phenomena of the CMP processes, as described above with reference to FIG. 9D. Thus, portions of the first metal pad portions 152 may not be in contact with but be spaced apart from the second metal pad portions 252 in the intersecting region of the first and second metal pads 150 and 250 when the first and second semiconductor chips CH1 and CH2 are stacked, as illustrated in FIG. 11A. Thereafter, when the bonding process (e.g., the thermal treatment process) is performed, the first and second metal pad portions 152 and 252 may protrude toward an air gap AG by thermal expansion of the metal of the first and second metal pad portions 152 and 252. Thus, the first and second metal pad portions 152 and 252 may be in contact with and bonded to each other in the intersecting region of the first and second metal pads 150 and 250, as illustrated in FIG. 11B.

A contact pressure Pc may occur between the first and second metal pad portions 152 and 252 which are in contact with each other. The contact pressure Pc may be a factor that tends to induce movement of a metal ingredient (e.g., copper) in the first and second metal pad portions 152 and 252 to a region in which the contact pressure Pc does not occur (i.e., to the first and second metal pad portions 152 and 252 exposed by the air gap AG). Such potential movement is illustrated, for example, by arrow F of FIG. 11B. According to some embodiments of the inventive concepts, the first and second partitions 154 and 254 may be disposed between the first metal pad portions 152 adjacent each other and between the second metal pad portions 252 adjacent each other, respectively. Thus, it is possible to inhibit the metal ingredient in the first and second metal pad portions 152 and 252 in contact with each other from being moved by the contact pressure Pc. As a result, it is possible to prevent or reduce contact failure which may occur between the first and second metal pad portions 152 and 252 by the movement of the metal ingredient caused by the contact pressure Pc. In other words, a reliable and stable electrical connection may be realized between the first and second metal pads 150 and 250.

Figure 12:
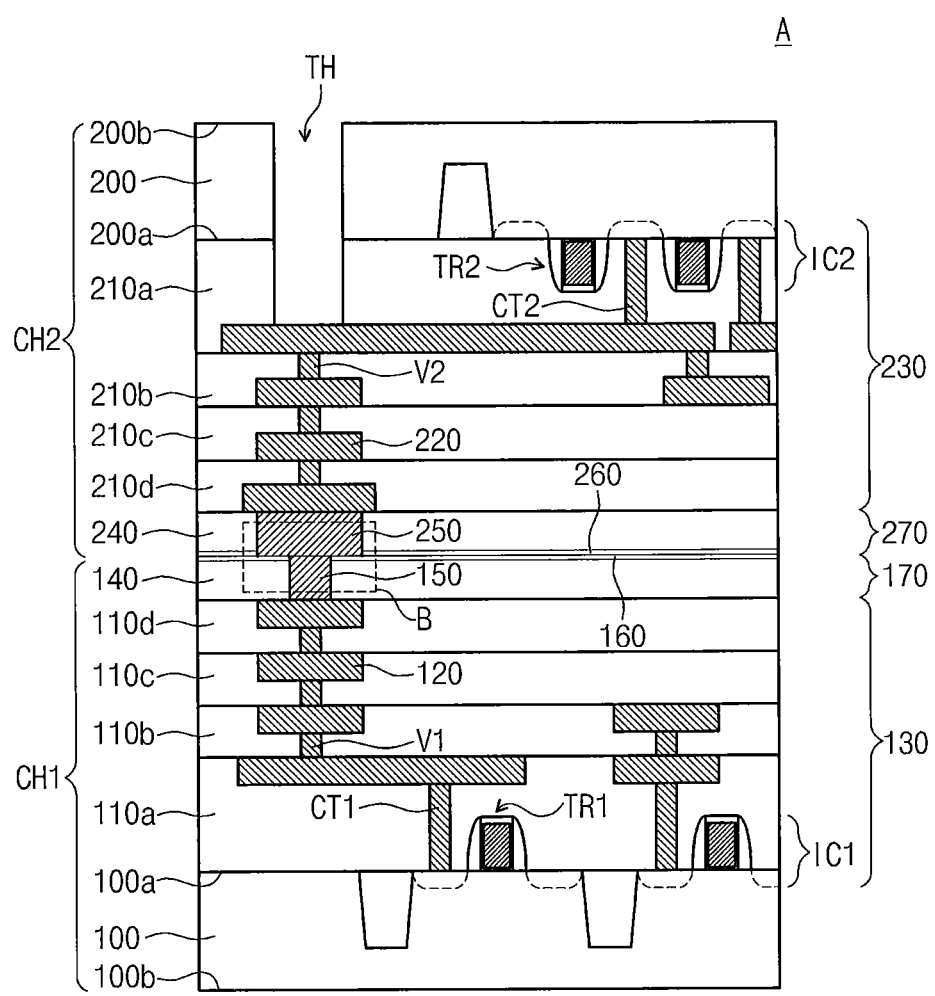

Referring to FIG. 12, a through-hole TH may be formed to penetrate the second substrate 200. The through-hole TH may penetrate both the back surface 200b and the front surface 200a of the second substrate 200. In addition, the through-hole TH may further penetrate the second interlayer insulating layer 210a. Thus, the second metal line 220 disposed in the second interlayer insulating layer 210a may be exposed through the through-hole TH.

Referring again to FIG. 2, a through-via 280 may be formed by filling the through-hole TH with a conductive material (e.g., copper (Cu) and/or tungsten (W)). Subsequently, a bonding pad 8 may be formed on the through-via 280. In other words, the bonding pad 8 may be formed on the back surface 200b of the second substrate 200 so as to be electrically connected to the through-via 280.

Figure 13:
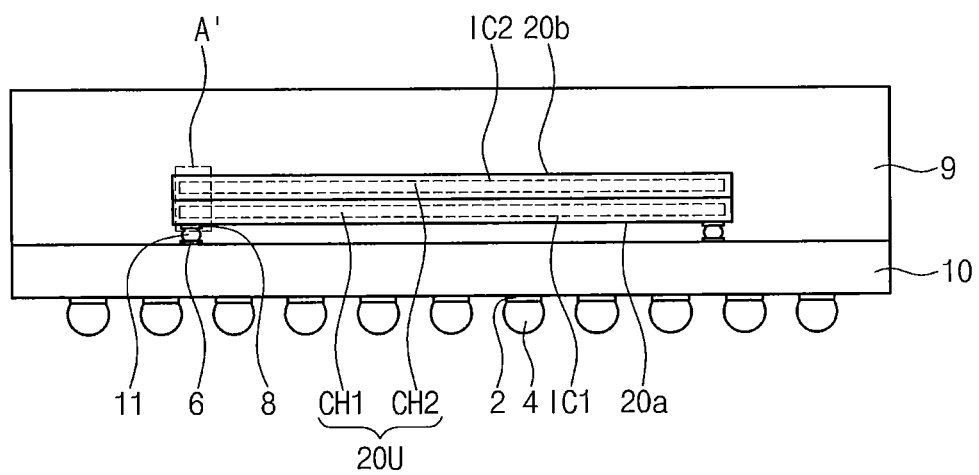
FIG. 13 is a cross-sectional view illustrating a semiconductor package according to some embodiments of the inventive concepts.
Figure 14:
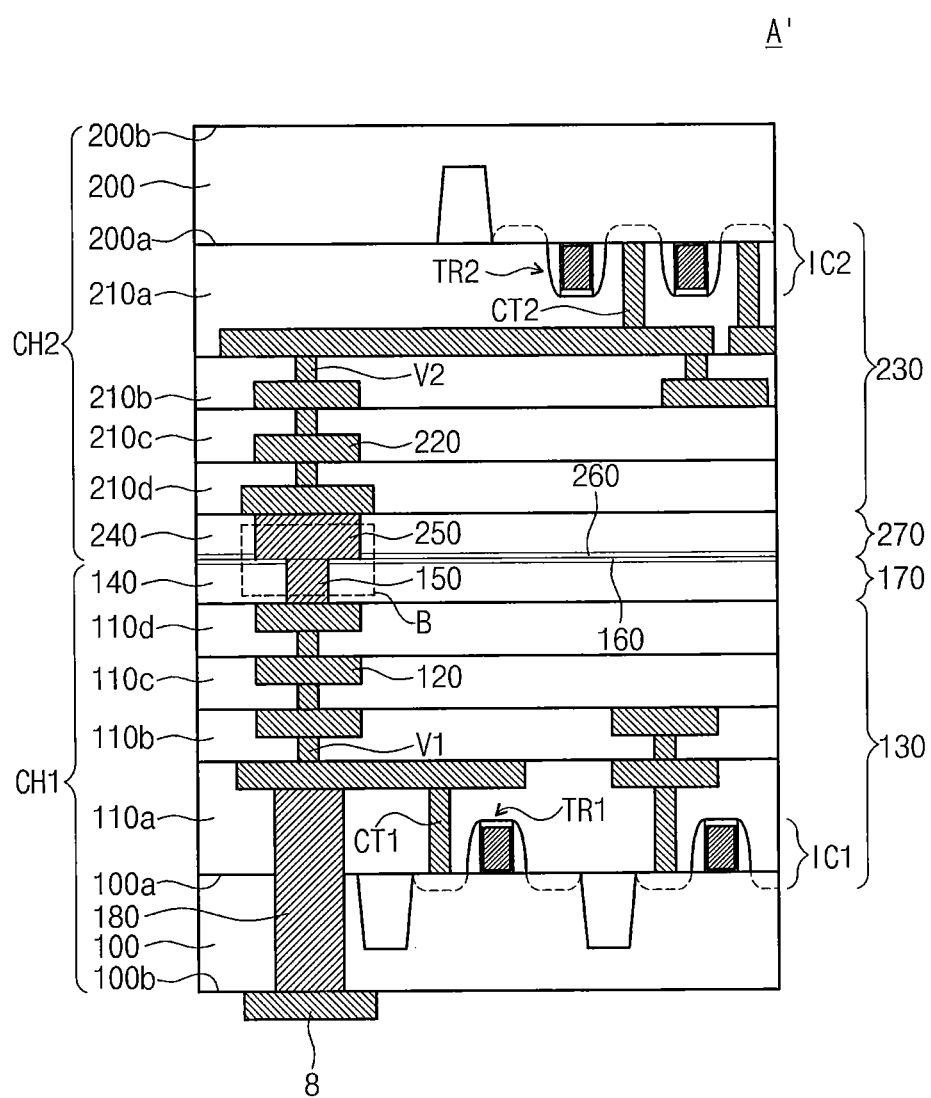
FIG. 14 is an enlarged cross-sectional view of portion 'A'' of FIG. 13 illustrating a chip stack structure according to some embodiments of the inventive concepts.

FIG. 13 is a cross-sectional view illustrating a semiconductor package according to some embodiments of the inventive concepts. FIG. 14 is an enlarged cross-sectional view of portion 'A' of FIG. 13 illustrating a chip stack structure according to some embodiments of the inventive concepts. Hereinafter, the detailed descriptions to the same technical features as in the embodiments of FIGS. 1 and 2 will be omitted or mentioned briefly for the purpose of ease and convenience in explanation.

Referring to FIGS. 13 and 14, a chip stack structure 20U may be mounted on a package substrate 10. The chip stack structure 20U may include a first semiconductor chip CH1 and a second semiconductor chip CH2 which are vertically stacked. The first and second semiconductor chips CH1 and CI-12 may be physically and/or electrically coupled or bonded to each other by a wafer-level stacking method, thereby forming the chip stack structure 20U. The first semiconductor chip CH1 may include a through-via 180. Other elements of the first semiconductor chip CH1 may be substantially the same as corresponding elements of the first semiconductor chip CH1 of FIGS. 1 and 2. The through-via 180 may penetrate the first substrate 100 and a portion (e.g., the first interlayer insulating layer 110a) of the first interlayer insulating layers 110a to 110d so as to be connected to at least one of the first metal lines 120. The second semiconductor chip CH2 may not include the through-via 280 illustrated in FIGS. 1 and 2. Other elements of the second semiconductor chip CH2 may be substantially the same as corresponding elements of the second semiconductor chip CH2 of FIGS. 1 and 2. A portion 'B' of FIG. 14 which illustrates a bonded structure of the first and second connecting layers 170 and 270 may be the same or similar as described with reference to FIG. 3. In other words, the first and second metal pads 150 and 250 of FIGS. 13 and 14 may be the same or similar as described with reference to FIGS. 3, 4A, and 4B. In addition, the first and second metal pads 150 and 250 may intersect each other, as described with reference to FIGS. 5A and 5B.

In the present embodiments, the chip stack structure 20U may be electrically connected to the package substrate 10 through connection terminals 11, unlike FIG. 1. The connection terminals 11 may include a conductive material and may have a solder shape and/or a bump shape. Bonding pads 8 may be disposed on the first surface 20a of the chip stack structure 20U (i.e., on the back surface 100b of the first substrate 100). The bonding pads 8 may be electrically connected to the second external connection pads 6 through the connection terminals 11. Other elements of the semiconductor package according to the present embodiment may be the same or similar as corresponding elements of the semiconductor package described with reference to FIGS. 1 and 2.

Figure 15:
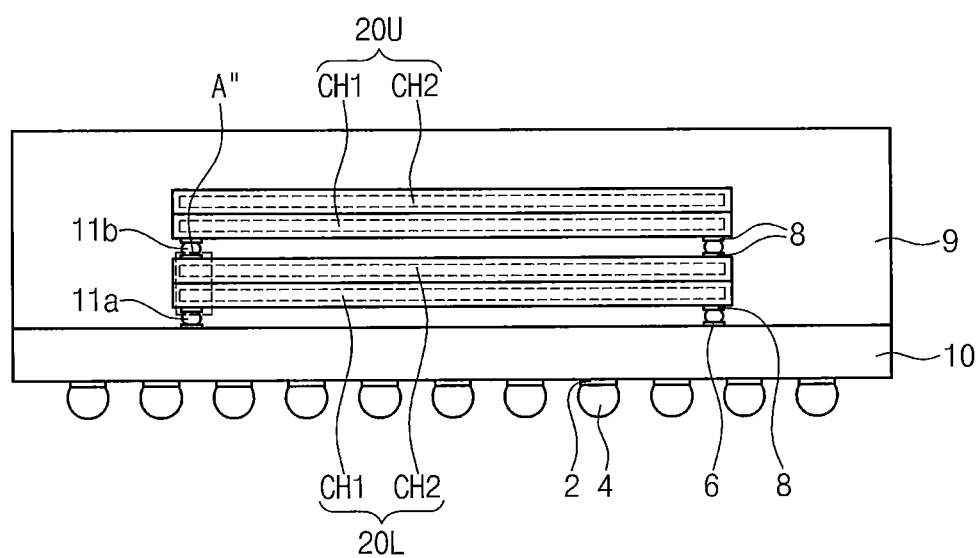
FIG. 15 is a cross-sectional view illustrating a semiconductor package according to some embodiments of the inventive concepts.
Figure 16:
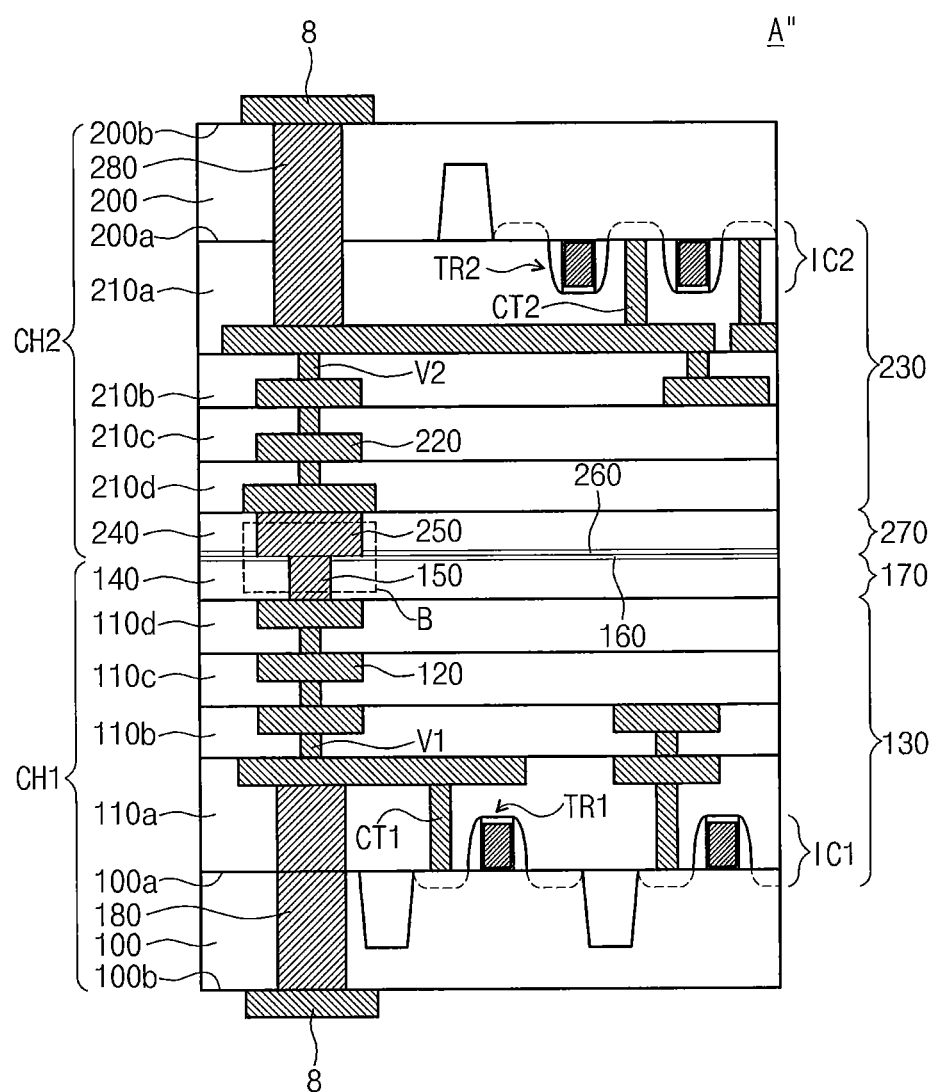
FIG. 16 is an enlarged cross-sectional view of portion 'A''' of FIG. 15 illustrating a chip stack structure according to some embodiments of the inventive concepts.

FIG. 15 is a cross-sectional view illustrating a semiconductor package according to some embodiments of the inventive concepts. FIG. 16 is an enlarged cross-sectional view of portion 'A'" of FIG. 15 illustrating a chip stack structure according to some embodiments of the inventive concepts. Hereinafter, the detailed descriptions to the same technical features as in the embodiment of FIGS. 1 and 2 will be omitted or mentioned briefly for the purpose of ease and convenience in explanation.

Referring to FIGS. 15 and 16, a plurality of chip stack structures may be stacked on a package substrate 10. In some embodiments, a first chip stack structure 20L and a second chip stack structure 20U may be stacked on the package substrate 10. The first and second chip stack structures 20L and 20U may be vertically stacked and may be vertically spaced apart from each other. Semiconductor chips CH1 and CH2 of the first chip stack structure 20L may include at least one through-via 180 and at least one through-via 280, respectively. The semiconductor chips CH1 and CH2 of the first chip stack structure 20L may be physically and electrically coupled to each other. The second chip stack structure 20U may be substantially the same as the chip stack structure 20U of FIGS. 13 and 14. In other words, semiconductor chips CH1 and CH2 of the second chip stack structure 20U may include a through-via 180 but not a through-via 280. In some embodiments, the first and second metal pads 150 and 250 of the semiconductor chips CH1 and CH2 of the first chip stack structure 20L may be the same or similar as described with reference to FIGS. 3, 4A, and 4B. In addition, the first and second metal pads 150 and 250 of the first chip stack structure 20L may intersect each other, as described with reference to FIGS. 5A and 5B.

The first chip stack structure 20L may be electrically connected to the package substrate 10 through first connection terminals 11a. In addition, the first and second chip stack structures 20L and 20U may be electrically connected to each other through second connection terminals 11b. The first connection terminals 11a and the second connection terminals 11b may be the same or similar as the connection terminals 11 of FIGS. 13 and 14. Other elements of the semiconductor package according to the present embodiment may be the same or similar as corresponding elements of the semiconductor package described with reference to FIGS. 1 and 2.

In some embodiments, three or more chip stack structures may be stacked on the package substrate 10. Each of the three or more chip stack structures may be the same or similar as one of the chip stack structures 20L and 20U described herein. In some embodiments, an additional semiconductor chip and one of the chip stack structures 20L and 20U described above may be stacked on the package substrate 10.

Figure 17:
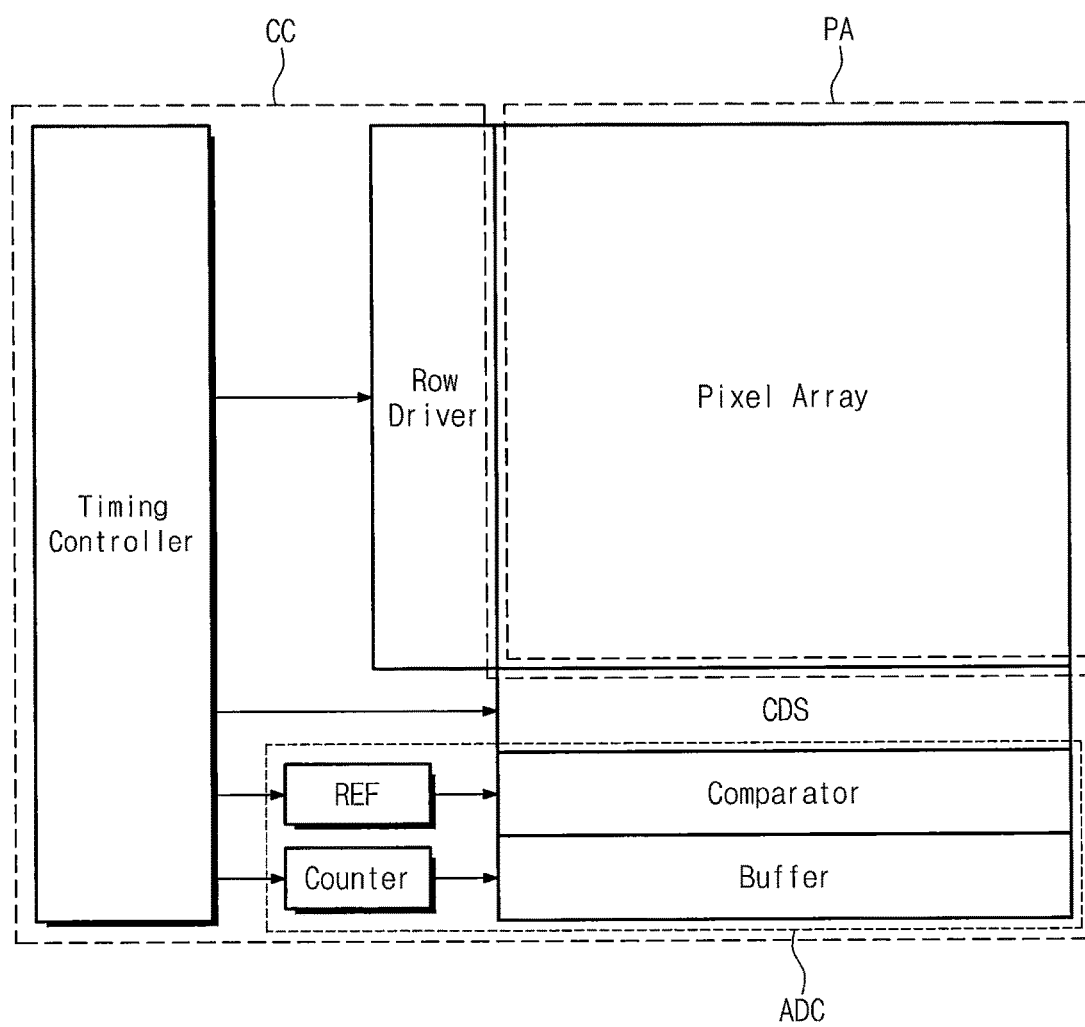
FIG. 17 is a schematic block diagram illustrating an image sensor according to some embodiments of the inventive concepts.

FIG. 17 is a schematic block diagram illustrating an image sensor according to some embodiments of the inventive concepts. For example, an image sensor of FIG. 17 may be a complementary metal-oxide-semiconductor (CMOS) image sensor.

Referring to FIG. 17, the image sensor may include a pixel array PA and a signal processing part CC.

The pixel array PA may convert incident light into electrical signals. The pixel array PA may include a plurality of unit pixels (not shown) arranged in a matrix form. The pixel array PA may be driven in response to driving signals provided from the signal processing part CC and may provide the converted electrical signals to the signal processing part CC.

The signal processing part CC may process the electrical signals to generate image data. The signal processing part CC may include a row driver, a correlated double sampler (CDS), an analog-to-digital converter (ADC), and a timing controller.

The row driver may be connected to each row of the pixel array PA and may generate a driving signal for driving a respective row of the pixel array PA. For example, the unit pixels included in a given row of the pixel array PA may be driven as a driving unit by the row driver.

The CDS may obtain a difference between a reference voltage showing a reset state of the unit pixel and an output voltage showing a signal corresponding to the incident light by means of a capacitor and/or a switch, thereby performing a correlated double sampling process. In addition, the CDS may output an analog sampling signal corresponding to an effective signal component. The CDS may include CDS circuits that are connected to column lines of the pixel array PA, respectively. The CDS may output an analog sampling signal corresponding to the effective signal component from a corresponding column.

The ADC may convert an analog image signal corresponding to the effective signal component into a digital image signal. The ADC may include a reference signal generator (REF), a comparator, a counter, and a buffer. The reference signal generator (REF) may generate a reference signal (e.g., a lamp signal having a predetermined gradient) and may provide the lamp signal as a reference signal of the comparator. The comparator may compare the analog sampling signal output from each column by the CDS with the lamp signal generated from the reference signal generator (REF), thereby outputting comparison signals that have transition time points according to the effective signal components, respectively. The counter may perform a counting operation to generate a counting signal and may provide the counting signal to the buffer. The buffer may include a plurality of latch circuits respectively connected to the column lines. The buffer may latch the counting signal output from the counter with respect to each of the column lines in response to the transition of each of the comparison signals, thereby outputting the latched counting signal as image data.

The timing controller may control operation timings of the row driver, the CDS, and the ADC. The timing controller may provide timing signals and control signals to the row driver, the CDS, and the ADC.

In the embodiment of FIG. 17, the image sensor may perform the analog double sampling operation. However, embodiments of the inventive concepts are not limited thereto. In certain embodiments, the image sensor may perform a digital double sampling (DDS) operation. In the DDS operation, an analog signal about a reset component in an initial state of a pixel and an analog signal about a signal component may be converted into two digital signals and then a difference between the two digital signals may be extracted as the effective signal component.

Figure 18:
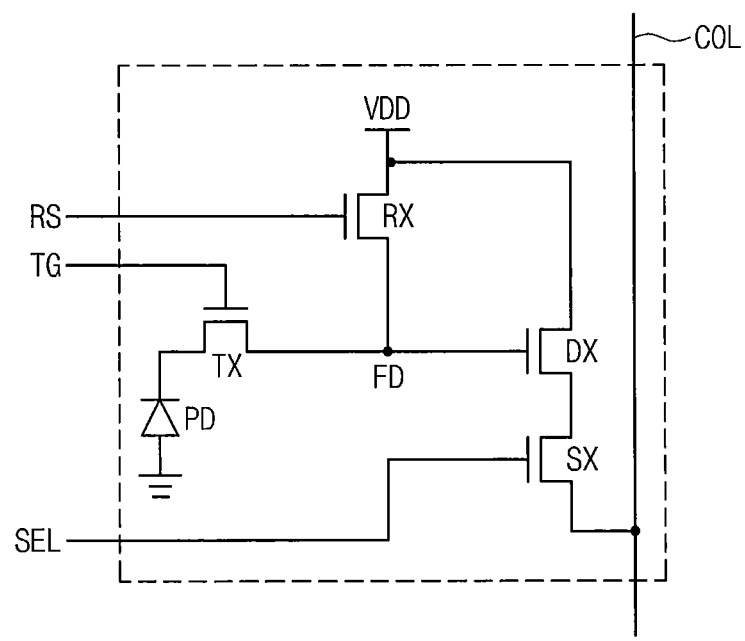
FIG. 18 is a circuit diagram illustrating a unit pixel included in a pixel array of an image sensor according to some embodiments of the inventive concepts.

FIG. 18 is a circuit diagram illustrating a unit pixel included in a pixel array of an image sensor according to some embodiments of the inventive concepts.

Referring to FIG. 18, a unit pixel may include a photodiode PD used as a photo sensitive device. In addition, the unit pixel may further include a transfer transistor TX, a reset transistor RX, a drive transistor DX, and a selection transistor SX which constitute a readout circuit.

The photodiode PD may receive light (e.g., visible light or infrared light) from an external system and may generate photo charges based on the received light. In some embodiments, the unit pixel may include a photo transistor, a photo gate, or a pinned photodiode, which is used together with the photodiode PD or is used instead of the photodiode PD.

The photo charges generated from the photodiode PD may be transferred into a floating diffusion node FD through the transfer transistor TX. For example, when the transfer control signal TG coupled to a gate of the transfer transistor TX has a first level (e.g., a high level), the transfer transistor TX may be turned-on and the photo charges generated from the photodiode PD may be transferred into the floating diffusion node FD through the turned-on transfer transistor TX.

The drive transistor DX may act as a source follower buffer amplifier to amplify a signal corresponding to charges stored in the floating diffusion node FD. The selection transistor SX may transmit the amplified signal to a column line COL in response to a selection signal SEL coupled to a gate of the selection transistor SX. The floating diffusion node FD may be reset by the reset transistor RX. For example, the reset transistor RX may discharge the photo charges stored in the floating diffusion node FD at a period for CDS operation in response to a reset signal RS coupled to a gate of the reset transistor RX.

In FIG. 18, the unit pixel including one photodiode PD and four MOS transistors TX, RX, DX, and SX is illustrated as an example. However, embodiments of the inventive concepts are not limited thereto.

Figure 19:
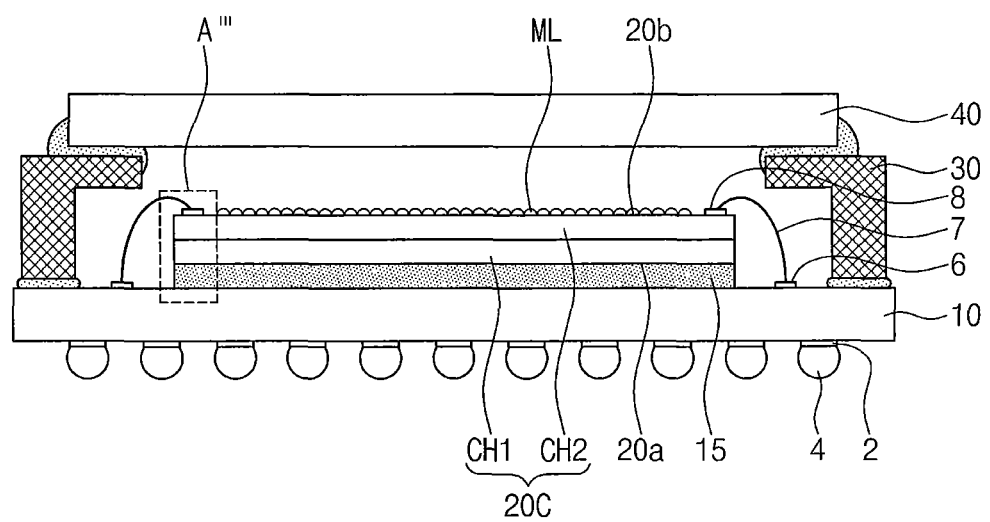
FIG. 19 is a cross-sectional view illustrating a semiconductor package according to some embodiments of the inventive concepts.
Figure 20:
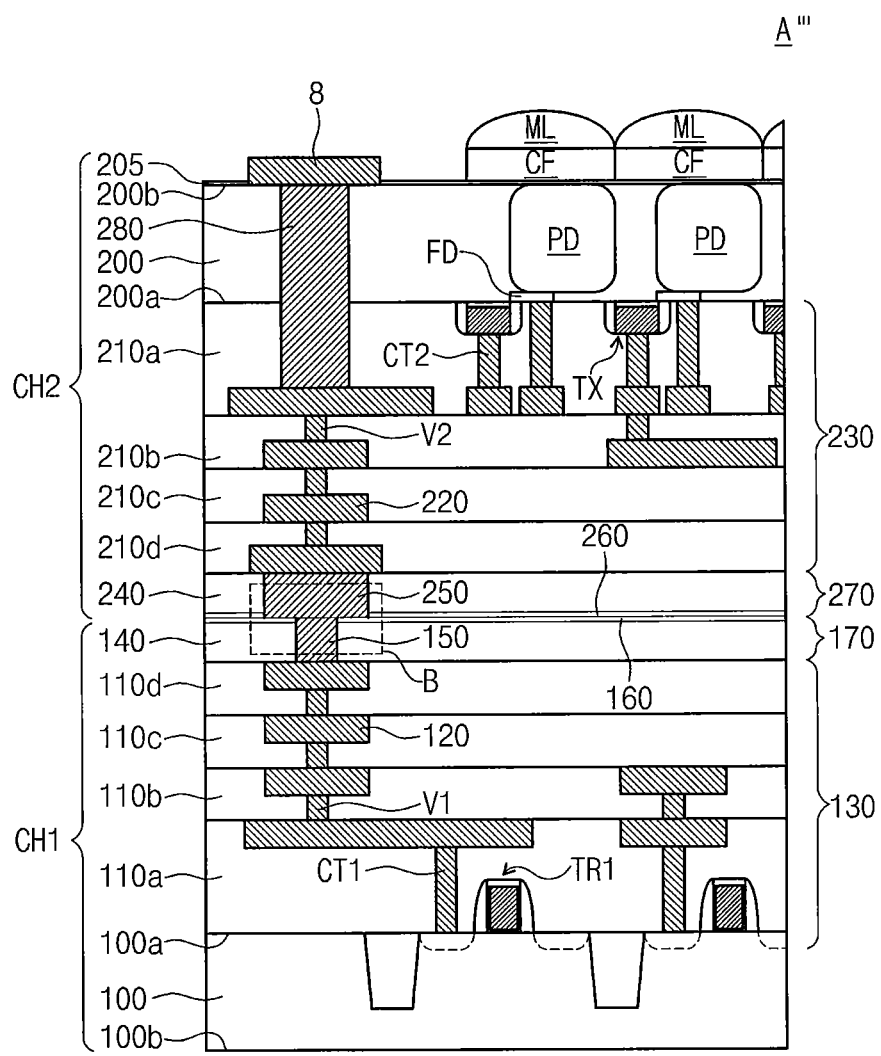
FIG. 20 is an enlarged cross-sectional view of portion 'A'''' of FIG. 19 illustrating a chip stack structure according to some embodiments of the inventive concepts.

FIG. 19 is a cross-sectional view illustrating a semiconductor package according to some embodiments of the inventive concepts. FIG. 20 is an enlarged cross-sectional view of portion 'A'''' of FIG. 19 illustrating a chip stack structure according to some embodiments of the inventive concepts. Hereinafter, the detailed descriptions to the same technical features as in the embodiment of FIGS. 1 and 2 will be omitted or mentioned briefly for the purpose of ease and convenience in explanation.

Referring to FIGS. 19 and 20, a chip stack structure 20C may be mounted on a package substrate 10. In addition, a holder 30 may be disposed on the package substrate 10. The holder 30 may have a top surface spaced apart from a surface of the chip stack structure 20C. A transparent substrate 40 may be disposed to be adjacent to the top surface of the holder 30.

The chip stack structure 20C may have a first surface 20a facing the package substrate 10 and a second surface 20b opposite to the first surface 20a. In detail, the chip stack structure 20C may include a first semiconductor chip CH1 and a second semiconductor chip CH2 which are vertically stacked. A plurality of micro lenses ML may be disposed on the second surface 20b of the chip stack structure 20C.

The first semiconductor chip CH1 may include a first substrate 100, a first circuit layer 130 on the first substrate 100, and a first connecting layer 170 on the first circuit layer 130. The first substrate 100, the first circuit layer 130, and the first connecting layer 170 may be the same or similar as described with reference to FIGS. 1 and 2. In addition, the first upper insulating layer 140, the first metal pad 150, and the first bonding insulating layer 160 of the first connecting layer 170 may be the same as similar as described with reference to FIGS. 3 and 4A. In some embodiments, the first semiconductor chip CH1 may be a logic chip. For example, the first semiconductor chip CH1 may include the signal processing part CC described with reference to FIG. 17. The second semiconductor chip CH2 may be a pixel array chip. Thus, the second semiconductor chip CH2 may include the pixel array PA described with reference to FIG. 17.

The second semiconductor chip CH2 may include photoelectric conversion parts PD, floating diffusion regions FD, and readout circuits which are formed in and/or at a second substrate 200. The readout circuits may include, for example, transfer transistors TX. The second substrate 200 may include a semiconductor layer formed by an epitaxial process and may include a semiconductor substrate doped with, for example, P-type dopants.

Unit pixels may generate image data in response to light incident on a back surface 200b of the second substrate 200. In other words, the chip stack structure 20C according to some embodiments of the inventive concepts may include a backside illuminated image sensor (BIS).

For example, a plurality of transistors transferring and amplifying an electrical signal (e.g., photo charges) corresponding to the incident light may be disposed on a front surface 200a of the second substrate 200 in the backside illuminated image sensor including the unit pixels. In addition, color filters CF and the micro lenses ML for providing the incident light to the photoelectric conversion parts PD may be disposed on the back surface 200b of the second substrate 200.

The photoelectric conversion parts PD may be disposed in the second substrate 200 to generate the photo charges corresponding to the incident light. For example, electron-hole pairs corresponding to the incident light may be generated in each of the photoelectric conversion parts PD, and the photoelectric conversion part PD may collect these electrons or holes. The photoelectric conversion part PD may be doped with dopants of which a conductivity type is different from that of dopants of the second substrate 200. For example, the photoelectric conversion part PD may be doped with N-type dopants. In some embodiments, the photoelectric conversion part PD may be a photodiode. However, embodiments of the inventive concepts are not limited thereto. In certain embodiments, the photoelectric conversion part PD may include a photo transistor, a photo gate, a pinned photodiode, or any combination thereof.

The transfer transistors TX may be disposed on the front surface 200a of the second substrate 200. The transfer transistors TX may transfer the photo charges generated from the photoelectric conversion parts PD into the floating diffusion regions FD formed in the second substrate 200. In other words, the transfer transistors TX may receive transfer signals. When the transfer transistors TX are turned-on by the transfer signals, the photo charges may be transmitted into the floating diffusion regions FD.

The floating diffusion regions FD may receive the photo charges through the transfer transistors TX. The image data may be generated based on the amounts of the photo charges transmitted in the floating diffusion regions FD.

The color filters CF may be disposed to correspond to the photoelectric conversion parts PD, respectively. The color filters CF may be arranged in a matrix form to constitute a color filter array. In some embodiments, the color filter array may have a Bayer pattern structure including red filters, green filters, and/or blue filters. In these embodiments, the color filters CF may be the red filter, the green filter, or the blue filter. In certain embodiments, the color filter array may include yellow filters, magenta filters, and/or cyan filters. In these embodiments, the color filters CF may be the yellow filter, the magenta filter, or the cyan filter. In some embodiments, the color filter array may additionally include a white filter.

The micro lenses ML may be disposed on the color filters CF in such a way that the micro lenses ML correspond to the photoelectric conversion parts PD, respectively. The micro lenses ML may adjust paths of the incident light to collect the incident light in the photoelectric conversion parts PD. The micro lenses ML may be arranged in a matrix form to constitute a micro lens array.

An anti-reflection layer 205 may be provided between the back surface 200b of the second substrate 200 and the color filters CF. The anti-reflection layer 205 may prevent the incident light from being reflected by the back surface 200b of the second substrate 200. In some embodiments, the anti-reflection layer 205 may have a multi-layered structure in which material layers having different reflective indices from each other are alternately stacked. In this case, a transmittance of the anti-reflection layer 205 may be improved as the numbers of the material layers alternately stacked increase.

Second interlayer insulating layers 210a, 210b, 210c, and 210d may be stacked on the front surface 200a of the second substrate 200. Second contacts CT2, second metal lines 220, and second vias V2 may be disposed in the second interlayer insulating layers 210a, 210b, 210c, and 210d. The second metal lines 220 may be electrically connected to each other through the second vias V2. In addition, the second metal lines 220 may be electrically connected to the readout circuits (e.g., the transfer transistors TX) through the second contacts CT2. The second contacts CT2, the second metal lines 220, the second vias V2, and the second interlayer insulating layers 210a, 210b, 201c, and 210d may constitute a second circuit layer 230.

A second connecting layer 270 may be disposed on the second circuit layer 230. The second connecting layer 270 may include a second upper insulating layer 240 disposed on the second interlayer insulating layer (e.g. second interlayer insulating layer 210d) that is furthest from the second substrate 200, a second metal pad 250 disposed in the second upper insulating layer 240, and a second bonding insulating layer 260 covering a top surface of the second upper insulating layer 240 and exposing the second metal pad 250. The second upper insulating layer 240, the second metal pad 250, and the second bonding insulating layer 260 may be the same or similar as described with reference to FIGS. 3 and 4B.

Meanwhile, the first semiconductor chip CH1 may include additional readout circuits and the signal processing part CC. A plurality of first transistors TR1, which are formed at the first substrate 100, may constitute the additional readout circuits or the signal processing part CC. For example, the additional readout circuits of the first semiconductor chip CH1 may include reset transistors, drive transistors, and/or selection transistors. In certain embodiments, the additional readout circuits including the reset, drive and/or selection transistors may be formed on the second substrate 200. However, embodiments of the inventive concepts are not limited thereto. The reset transistor may receive a reset signal. The reset transistor may receive a voltage for resetting the floating diffusion region FD. For example, when the reset signal is activated, charges accumulated in the floating diffusion region FD may be discharged by the voltage to reset the floating diffusion region FD.

The second semiconductor chip CH2 may be overturned and then located on the first semiconductor chip CH1. Thus, the first connecting layer 170 of the first semiconductor chip CH1 may face the second connecting layer 270 of the second semiconductor chip CH2. The first connecting layer 170 and the second connecting layer 270 may be physically and/or electrically connected to each other, and thus the first semiconductor chip CH1 may be coupled and/or bonded to the second semiconductor chip CH2. In other words, the first metal pad 150 and the first bonding insulating layer 160 may be in contact with and bonded to the second metal pad 250 and the second bonding insulating layer 260, respectively. A portion 'B' of FIG. 20 which illustrates a bonded structure of the first and second connecting layers 170 and 270 may be substantially the same or similar as described with reference to FIG. 3. In other words, the first and second metal pads 150 and 250 of FIGS. 19 and 20 may be substantially the same or similar as described with reference to FIGS. 3, 4A, and 4B. In addition, the first and second metal pads 150 and 250 may intersect each other, as described with reference to FIGS. 5A and 5B.

In some embodiments, the second semiconductor chip CH2 may include at least one through-via 280 penetrating the second substrate 200. The through-via 280 may be laterally spaced apart from the unit pixels disposed in the second semiconductor chip CH2. The through-via 280 may be electrically connected to at least one of the second metal lines 220. Bonding pads 8 may be disposed on the back surface 200b of the second substrate 200. In some embodiments, the bonding pads 8 may be input/output (I/O) pads to which I/O signals are applied. The bonding pad 8 may be electrically connected to the through-via 280 penetrating the back surface 200*b* of the second substrate 200.

According to some embodiments of the inventive concepts, each of the first and second metal pads of the first and second semiconductor chips may have a rectangular shape when viewed from a plan view. In addition, each of the first and second metal pads may include the metal pad portions separated from each other by partitions. Thus, a substantially constant bonding area may be obtained and a reliable and stable electrical connection may be realized between the first and second metal pads. As a result, it is possible to improve the electrical characteristics and reliability of the chip stack structure in which the first and second semiconductor chips are stacked and are coupled to each other.

While the inventive concepts have been described with reference to example embodiments, it will be apparent to those skilled in the art that various changes and modifications may be made without departing from the spirit and scope of the inventive concepts. Therefore, it should be understood that the above embodiments are not limiting, but illustrative. Thus, the scope of the inventive concepts are to be determined by the broadest permissible interpretation of the following claims and their equivalents, and shall not be restricted or limited by the foregoing description.

What is claimed is:

1. A semiconductor device comprising:
a chip stack structure comprising a first semiconductor chip and a second semiconductor chip stacked on the first semiconductor chip,
wherein the first semiconductor chip comprises:
a first substrate;
a first circuit layer on a front surface of the first substrate; and
a first connecting layer on the first circuit layer, the first connecting layer comprising a first metal pad electrically connected to the first circuit layer,
wherein the second semiconductor chip comprises:
a second substrate;
a second circuit layer on a front surface of the second substrate; and
a second connecting layer on the second circuit layer, the second connecting layer comprising a second metal pad electrically connected to the second circuit layer,
wherein the first connecting layer and the second connecting layer face each other,
wherein the first metal pad and the second metal pad are in contact with each other to couple the first and second semiconductor chips to each other,
wherein the first metal pad comprises a plurality of first metal pad portions separated from each other by first partitions,
wherein the second metal pad comprises a plurality of second metal pad portions separated from each other by second partitions, and
wherein at least one of the first and second semiconductor chips further comprises a through-via penetrating the respective substrate thereof.

2. The semiconductor device of claim 1, wherein each of the first and second metal pads has a rectangular shape when viewed in a plan view, and
wherein the first and second metal pads intersect each other.

3. The semiconductor device of claim 2, wherein at least one of the plurality of first metal pad portions is in contact with at least one of the plurality of second metal pad portions in a region of the first and second metal pads in which the first and second metal pads intersect.

4. The semiconductor device of claim 2, wherein the plurality of first metal pad portions are arranged in a long-axis direction of the first metal pad,
wherein each of the first partitions is between respective ones of the plurality of first metal pad portions that are adjacent each other,
wherein the plurality of second metal pad portions are arranged in a long-axis direction of the second metal pad, and
wherein each of the second partitions is between respective ones of the plurality of second metal pad portions that are adjacent each other.

5. The semiconductor device of claim 4, wherein the first metal pad has a first length in the long-axis direction of the first metal pad and a first width in a short-axis direction of the first metal pad, and
wherein a ratio of the first length to the first width is 2 or greater.

6. The semiconductor device of claim 5, wherein the second metal pad has a second length in the long-axis direction of the second metal pad and a second width in a short-axis direction of the second metal pad, and
wherein a ratio of the second length to the second width is 2 or greater.

7. The semiconductor device of claim 1, wherein the first connecting layer further comprises:
a first upper insulating layer surrounding the first metal pad; and
a first bonding insulating layer on the first upper insulating layer and exposing the first metal pad,
wherein the second connecting layer further comprises:
a second upper insulating layer surrounding the second metal pad; and
a second bonding insulating layer on the second upper insulating layer and exposing the second metal pad, and
wherein the first bonding insulating layer is in contact with the second bonding insulating layer.

8. The semiconductor device of claim 7, wherein at least one of the first partitions contacts the first upper insulating layer, and
wherein at least one of the second partitions contacts the second upper insulating layer.

9. The semiconductor device of claim 8, wherein the first partitions include a same material as the first upper insulating layer, and
wherein the second partitions include a same material as the second upper insulating layer.

10. The semiconductor device of claim 1, wherein the first semiconductor chip comprises a first through-via and the second semiconductor chip comprises a second through-via,
wherein the first through-via of the first semiconductor chip is electrically connected to the first metal pad, and
wherein the second through-via of the second semiconductor chip is electrically connected to the second metal pad.

11. The semiconductor device of claim 1, wherein the first semiconductor chip is a logic chip,
wherein the second semiconductor chip is a pixel array chip, and
wherein the second semiconductor chip further comprises:
at least one photoelectric conversion part in the second substrate; and
a micro lens on a back surface of the second substrate, wherein the back surface of the second substrate is opposite to the front surface of the second substrate.

12. A semiconductor device comprising:
a first chip stack structure comprising a first semiconductor chip and a second semiconductor chip stacked on the first semiconductor chip,
wherein the first semiconductor chip comprises:
a first substrate;
a first circuit layer on a front surface of the first substrate; and
a first connecting layer on the first circuit layer, the first connecting layer comprising a first metal pad electrically connected to the first circuit layer,
wherein the second semiconductor chip comprises:
a second substrate;
a second circuit layer on a front surface of the second substrate; and
a second connecting layer on the second circuit layer, the second connecting layer comprising a second metal pad electrically connected to the second circuit layer,
wherein the first connecting layer and the second connecting layer face each other,
wherein the first metal pad and the second metal pad are in contact with each other to couple the first and second semiconductor chips to each other,
wherein the first metal pad comprises a plurality of first metal pad portions separated from each other by first partitions,
wherein the second metal pad comprises a plurality of second metal pad portions separated from each other by second partitions,
wherein the semiconductor device further comprises a second chip stack structure,
wherein the first chip stack structure and the second chip stack structure are vertically stacked and are vertically spaced apart from each other, and
wherein the first chip stack structure and the second chip stack structure are electrically connected to each other through connection terminals interposed therebetween.

13. A semiconductor device comprising:
a first semiconductor chip comprising a first substrate, a first circuit layer on a front surface of the first substrate, and a first connecting layer on the first circuit layer; and
a second semiconductor chip comprising a second substrate, a second circuit layer on a front surface of the second substrate, and a second connecting layer on the second circuit layer,
wherein the first connecting layer comprises a first metal pad electrically connected to the first circuit layer,
wherein the first metal pad has a rectangular planar shape,
wherein the first metal pad comprises: a plurality of first metal pad portions arranged in a long-axis direction of the first metal pad; and first partitions between respective ones of the plurality of first metal pad portions,
wherein the second connecting layer comprises a second metal pad electrically connected to the second circuit layer,
wherein the second metal pad has a rectangular planar shape,
wherein the second metal pad comprises: a plurality of second metal pad portions arranged in a long-axis direction of the second metal pad; and second partitions between respective ones of the plurality of second metal pad portions,
wherein the second semiconductor chip is disposed on the first semiconductor chip in such a way that the first and second connecting layers are in contact with each other and the first and second metal pads intersect each other, and
wherein at least one of the first and second semiconductor chips further comprises a through-via penetrating the respective substrate thereof.

14. The semiconductor device of claim 13, wherein the first circuit layer comprises:
a first integrated circuit;
first interlayer insulating layers covering the first integrated circuit; and
first metal lines in the first interlayer insulating layers,
wherein the second circuit layer comprises:
a second integrated circuit;
second interlayer insulating layers covering the second integrated circuit; and
second metal lines disposed in the second interlayer insulating layers, and
wherein the first and second connecting layers are between the first interlayer insulating layers and the second interlayer insulating layers.

15. The semiconductor device of claim 14, wherein the first connecting layer further comprises: a first upper insulating layer on the first interlayer insulating layers; and a first bonding insulating layer covering a surface of the first upper insulating layer and exposing the first metal pad,
wherein the second connecting layer further comprises: a second upper insulating layer on the second interlayer insulating layers; and a second bonding insulating layer covering a surface of the second upper insulating layer and exposing the second metal pad, and
wherein the first bonding insulating layer is in contact with the second bonding insulating layer.

16. The semiconductor device of claim 15, wherein the first metal pad penetrates the first upper insulating layer so as to be connected directly to at least one of the first metal lines, and
wherein the second metal pad penetrates the second upper insulating layer so as to be connected directly to at least one of the second metal lines.

17. The semiconductor device of claim 13, wherein the second semiconductor chip comprises the through-via,
wherein the through-via penetrates the second substrate so as to be electrically connected to the second metal pad, and
wherein the second semiconductor chip further comprises a bonding pad on a back surface of the second substrate so as to be electrically connected to the through-via.

18. The semiconductor device of claim 17, further comprising:
a package substrate on which the first and second semiconductor chips are disposed,
wherein the package substrate is electrically connected to the first and second semiconductor chips through the bonding pad.

* * * * *